(12) United States Patent
Sirbuly et al.

(10) Patent No.: US 11,871,672 B2
(45) Date of Patent: Jan. 9, 2024

(54) 3D PIEZOELECTRIC POLYMER MATERIALS AND DEVICES

(71) Applicant: The Regents of the University of California, Oakland, CA (US)

(72) Inventors: Donald J. Sirbuly, Carlsbad, CA (US); Shaochen Chen, San Diego, CA (US); Kanguk Kim, La Jolla, CA (US); Wei Zhu, San Diego, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 1114 days.

(21) Appl. No.: 16/660,647

(22) Filed: Oct. 22, 2019

(65) Prior Publication Data
US 2020/0161534 A1     May 21, 2020

Related U.S. Application Data

(62) Division of application No. 15/144,560, filed on May 2, 2016, now abandoned.
(Continued)

(51) Int. Cl.
   *H01L 41/37*    (2013.01)
   *H01L 41/33*    (2013.01)
(Continued)

(52) U.S. Cl.
   CPC ........... *H10N 30/092* (2023.02); *C08K 3/046* (2017.05); *C08K 3/22* (2013.01); *C08K 5/5419* (2013.01);
(Continued)

(58) Field of Classification Search
   CPC ........ H10N 30/00; H10N 30/08; H10N 30/80; H10N 30/092; H10N 30/852;
(Continued)

(56) References Cited

U.S. PATENT DOCUMENTS

| 4,575,330 A | 3/1986 | Hull |
|---|---|---|
| 6,197,846 B1 | 3/2001 | Rose |

(Continued)

FOREIGN PATENT DOCUMENTS

WO    WO-2019227082 A1 * 11/2019        B33Y 30/00

OTHER PUBLICATIONS

Evans, H.T., "An X-Ray Diffration Study of Tetragonal Barium Titanate", Acta Cryst., 1971, vol. 14, pp. 1019-1026.
(Continued)

*Primary Examiner* — Shawki S Ismail
*Assistant Examiner* — Monica Mata
(74) *Attorney, Agent, or Firm* — PERKINS COIE LLP

(57) ABSTRACT

Methods, systems, and devices are disclosed for fabricating 3D piezoelectric materials. In one aspect, a method includes photopolymerizing a selected portion of a two dimensional plane in a sample of a photolabile polymer solution containing piezoelectric nanoparticles to form a layer of a piezoelectric material, the photopolymerizing including directing light from a light source based on a pattern design in the selected portion of the photolabile polymer solution; and moving one or both of the sample and the directed light to photopolymerize another selected portion of another two dimensional plane in the sample to form another layer of the piezoelectric material.

20 Claims, 14 Drawing Sheets

Photoliable polymer solution containing piezoelectric nanoparticles         3D printing of any designed architecture

Related U.S. Application Data

(60) Provisional application No. 62/155,388, filed on Apr. 30, 2015.

(51) Int. Cl.

| | | |
|---|---|---|
| *H01L 41/18* | (2006.01) | |
| *H10N 30/092* | (2023.01) | |
| *C08L 67/07* | (2006.01) | |
| *C08K 5/5419* | (2006.01) | |
| *C08K 3/22* | (2006.01) | |
| *C08K 3/04* | (2006.01) | |
| *H10N 30/00* | (2023.01) | |
| *H10N 30/08* | (2023.01) | |
| *H10N 30/80* | (2023.01) | |
| *H10N 30/85* | (2023.01) | |
| *H04R 17/00* | (2006.01) | |
| *H10N 30/853* | (2023.01) | |

(52) U.S. Cl.
CPC .............. *C08L 67/07* (2013.01); *H10N 30/00* (2023.02); *H10N 30/08* (2023.02); *H10N 30/80* (2023.02); *H10N 30/852* (2023.02); *H04R 17/005* (2013.01); *H10N 30/8536* (2023.02)

(58) Field of Classification Search
CPC ...... H10N 30/8536; C08K 3/22; C08K 3/046; C08K 5/5419; C08L 67/07; H04R 17/005
USPC ......................................................... 310/350
See application file for complete search history.

(56) References Cited

U.S. PATENT DOCUMENTS

| | | | |
|---|---|---|---|
| 6,478,412 B1 | 11/2002 | Hanabata | |
| 10,297,741 B1* | 5/2019 | Benedict | C08K 3/08 |
| 10,305,022 B1* | 5/2019 | Benedict | C08L 75/04 |
| 2003/0116747 A1 | 6/2003 | Lem | |
| 2009/0261287 A1 | 10/2009 | Withey | |
| 2010/0117110 A1 | 5/2010 | Park | |
| 2011/0275890 A1* | 11/2011 | Wang | A61B 8/4461 |
| | | | 600/104 |
| 2011/0318528 A1 | 12/2011 | Cho | |
| 2012/0220035 A1* | 8/2012 | Lu | C12N 1/02 |
| | | | 435/378 |
| 2013/0211542 A1* | 8/2013 | McKee | B01D 71/60 |
| | | | 264/494 |
| 2014/0003652 A1* | 1/2014 | Fedorovskaya | G06F 16/20 |
| | | | 382/103 |
| 2014/0131908 A1 | 5/2014 | Sun | |
| 2014/0228252 A1* | 8/2014 | Kwon | G01N 33/552 |
| | | | 435/5 |
| 2014/0239527 A1 | 8/2014 | Lee | |
| 2014/0342192 A1* | 11/2014 | Wang | H01G 11/58 |
| | | | 429/7 |
| 2015/0102704 A1* | 4/2015 | Jakli | D06M 23/08 |
| | | | 310/311 |
| 2015/0309473 A1 | 10/2015 | Spadaccini | |
| 2017/0081536 A1* | 3/2017 | Brust | C09D 11/322 |
| 2018/0066131 A1* | 3/2018 | Jin | C08L 33/12 |
| 2020/0024421 A1* | 1/2020 | Slep | H05K 1/097 |
| 2021/0234089 A1* | 7/2021 | Zheng | B33Y 30/00 |

OTHER PUBLICATIONS

Kim et al., "3D Optical Printing of Piezoelectric Nanoparticle-Polymer Composite Materials," ACS Nano, 2014, 8 (10), pp. 9799-9806.

Park et al., "Flexible Nanocomposite Generator Made of BaTiO3 Nanoparticles and Graphitic Carbons", Adv. Mater., 2012, 24, pp. 2999-3004.

Chartier et al., "Additive manufacturing to produce complex 3D ceramic parts", J. Ceram. Sci. Tech., vol. 06(02), 2015, pp. 95-104.

Dufaud et al., "Stereolithography of lead zirconate titanate ceramics for MEMS application" Proc. SPIE vol. 5116, 2003, pp. 28-37.

Jang et al., "Preparation and characterization of Barium Titanate suspensions for stereolithography", J. Am. Cer. Soc., vol. 83(7), 2000, pp. 1804-1806.

Jiang et al., "Microstereolithography of lead zirconate titanate thick film on silicon substrate", Sens. Act., vol. 87, 2000, pp. 72-77.

Jiang et al., "Micro-stereolithography of 3D complex ceramic microstructures and PZT thick films on Si substrate", ASME publications MEMS vol. 1, 1999, pp. 67-74.

Jung et al., "Lead free NaNbO3 nanowires for high output piezo-electric nanogenerator", ACS Nano vol. 5(12), 2011, pp. 10041-10046.

Kim et al., "Preparation and characterization of UV-cured polyurethane acrylate/ZnO nanocomposite films based on surface modified ZnO", Prog. Org. Coatings, vol. 74, 2012, pp. 435-442.

Lu et al., "Preparation and characterization of UV-curab;e znO/polymer nanocomposite films", Polym. Inter., vol. 56, 2007, pp. 138-143.

Nagao et al., "Fabrication of highly refractive, transparent BaTiO3/poly(methyl methacrylate) composite films with high permittivites", Polym. Int. vol. 60, 2011, pp. 1180-1184.

O'Neill et al., "Advances in three dimensional rapid prototyping of microfluidic devices for biological applications", Biofl. vol. 8, 2014, 052114, 11 pages.

Sun et al., "The influence of the material properties on ceramic micro-stereolithpgraphy", Sens. Act. A vol. 101, 2002, pp. 364-370.

Torres-Filho et al., "Mechanical properties of acrylate networks formed by laser-induced polymerization. 2. Control of the mechanical properties", Chem. Mater., vol. 7(4), 1995, pp. 744-753.

Varadan et al., "Micro stereo lithography and fabrication of 3D MEMS and their applications", Proc. SPIE vol. 4592, 2001, pp. 9-20.

Xie et al., "Research on the curing performance of UV-LED light based stewreolithography", Opt. Laser Techn., vol. 44, 2012, pp. 1163-1171.

Zhang et al. ,"Micro-stereolithography for MEMS", DCS-vol. 66, Micro-electro-mechanical systems (MEMS) 1998, ASME, 1998, pp. 3-9.

\* cited by examiner

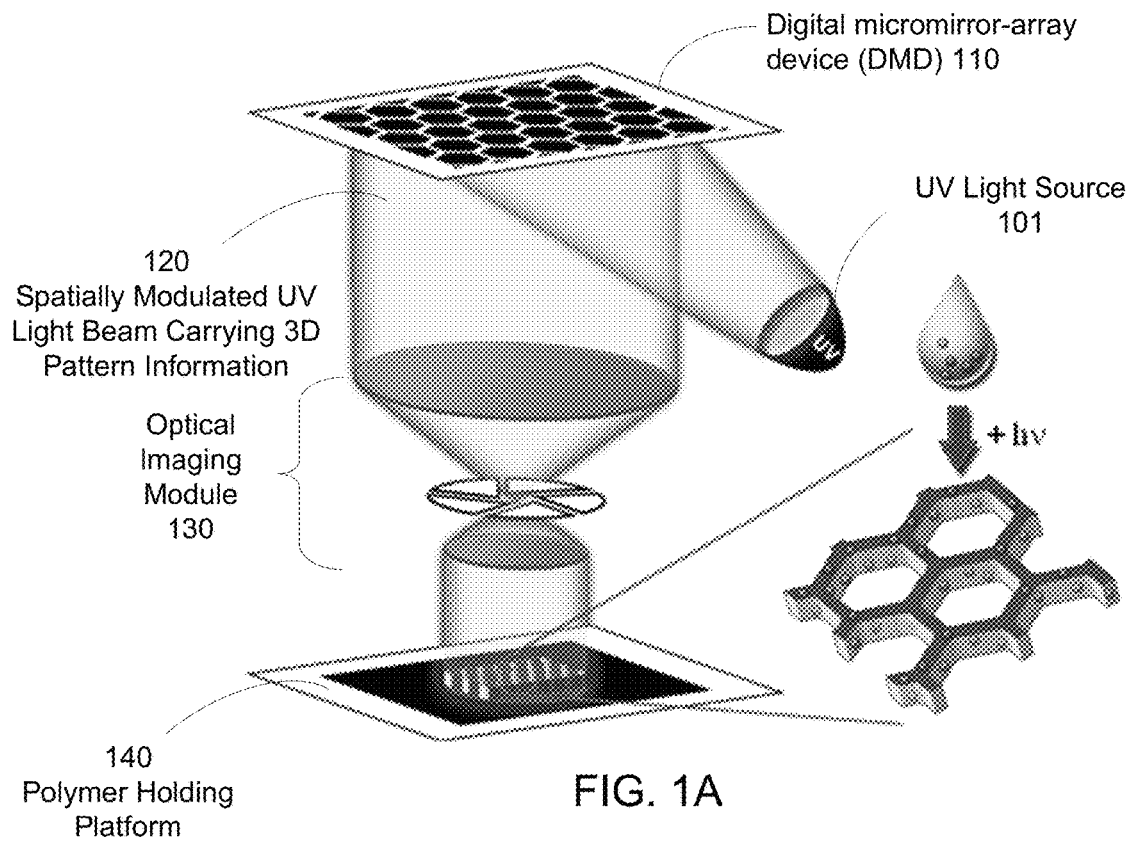
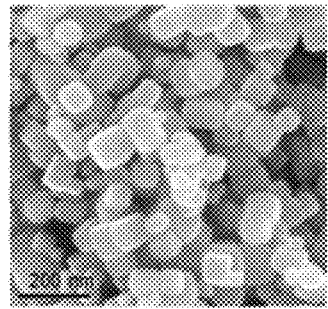
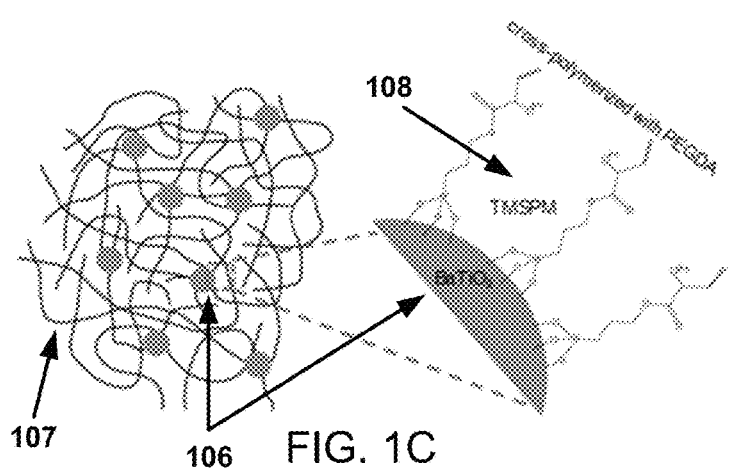
FIG. 1A
FIG. 1B
FIG. 1C

3D PIEZOELECTRIC POLYMER MATERIALS AND DEVICES

CROSS REFERENCE TO RELATED APPLICATIONS

This patent application is a divisional application of U.S. patent application Ser. No. 15/144,560, filed May 2, 2016, entitled "3D PIEZOELECTRIC POLYMER MATERIALS AND DEVICES" which claims the priority and benefits of U.S. Provisional Patent Application No. 62/155,388, filed Apr. 30, 2015, entitled "3D FABRICATION METHODS OF PIEZOELECTRIC POLYMER COMPOSITE MATERIALS." The entire content of the before-mentioned patent application is incorporated by reference as part of the disclosure of this application.

TECHNICAL FIELD

This patent document relates to systems, devices, and processes having specialized piezoelectric materials.

BACKGROUND

Piezoelectricity is a material property where electric charge accumulates in response to applied mechanical stress on the material. Example of materials that exhibit piezoelectricity can include certain crystals, ceramics, and biological matter, e.g., such as DNA, various proteins, and bone. The piezoelectric effect is a linear electromechanical interaction between the mechanical and the electrical state in crystalline materials with no inversion symmetry. The piezoelectric effect is a reversible process. The direct piezoelectric effect is the internal generation of electrical charge resulting from an applied mechanical force, and the converse piezoelectric effect is the internal generation of a mechanical strain resulting from an applied electrical field.

SUMMARY

A valuable property of piezoelectric materials is an ability to convert compressive/tensile stresses to an electric charge, or vice versa. An example of a piezoelectric material is a brittle ceramic known as lead zirconate titanate. Most piezoelectric materials in systems are based on brittle ceramics such as lead zirconate titanate. Another example of a piezoelectric material is a piezoelectric polymer such as materials in the polyvinylidene fluoride group that have good piezoelectric polymer performance. However, conventional techniques do not offer simple approaches to fabricating 3D structures in piezoelectric polymers or multilayered architectures which would open up infinite possibilities in the design of more complicated device geometries. The disclosed technology facilitates a cheaper and easier fabrication of 3D structures in piezoelectric polymers.

Disclosed are 3D manufacturing processes to manipulate piezoelectric polymers into virtually any shape using light-assisted polymerization. Any light projection techniques including stereolithography or direct photo-printing techniques including laser-assisted two-photon 3D printing can be used to polymerize the piezoelectric materials. Another light projection technique can include digital projection printing that can also be used to polymerize the piezoelectric materials. The disclosed methods can include using piezoelectric nanoparticles grafted to a photolabile polymer solution to manufacture biocompatible, mechanically flexible, size scalable, shape tunable, and highly responsive piezoelectric materials.

The subject matter described in this patent document can be implemented to provide one or more of the following features. For example, the polymerization process links up the polymer matrix to piezoelectric nanoparticles, which enables 3D piezoelectric materials to be written with control over the size and shape that is not afforded by any other technique. Exemplary applications of the disclosed technology can include a wide range of devices, systems, and processes utilizing direct and/or converse piezoelectric effects, e.g., non-volatile low voltage memory, loud speakers, acoustic imaging, energy harvesting, or electrical actuators, just to name a few. The disclosed technology can also be implemented to print virtually any 3D piezoelectric shape, while maintaining a strong piezoelectric coefficient and biocompatible properties, and thus is applicable to biomimetic materials (e.g., artificial skin, tympanic membrane), integrated micro/nanoelectromechanical systems (MEMS/NEMS, e.g., such as mechanical actuators), sensors (e.g., acoustic detection), bio-imaging (e.g., high resolution, compact ultrasonic imaging instruments), in vitro energy scavenging, and biometrics and security, among others.

A 3D piezoelectric material can have several useful applications. For example, a 3D piezoelectric polymer can be used in pressure sensing mouthguards for sports applications. For example, the disclosed technology can be used to provide embeddable, flexible pressure sensors with real time data read out capabilities. The real time data from the embeddable and flexible pressure sensors can be read by a coach using an portable device, such as an iPad. When the real time reading detects impacts large enough to cause a concussion, the coach or other personnel can be notified. Since the second hit after an initial injury to the head can be extremely serious and even deadly, cheap but effective polymer-based piezoelectric material could be a viable way to monitor impacts in sports, military, or other situations to reduce the chances of serious injury. The polymer-based piezoelectric material could be strategically placed for example in a helmet and when the material generates an output due to an impact, which is a function of pressure, the information related to the output could be relayed to an observer who would instantly know who received the hit, the location of the hit, and if the hit was at levels (assuming the transducers were calibrated) that could cause a traumatic brain injury.

In one implementation, a method is provided to fabricate a piezoelectric material and includes photopolymerizing a selected portion of a two dimensional plane in a sample of a photolabile polymer solution containing piezoelectric nanoparticles to form a layer of a piezoelectric material, the photopolymerizing including directing light from a light source based on a pattern design in the selected portion of the photolabile polymer solution; and moving one or both of the sample and the directed light to photopolymerize another selected portion of another two dimensional plane in the sample to form another layer of the piezoelectric material.

In another implementation, a device is provided to include a piezoelectric material structure which includes a three-dimensional structure; and a plurality of piezoelectric nanoparticles grafted to the three-dimensional structure. The piezoelectric material structure is operable to generate an electric charge in response to an applied mechanical force and to generate a mechanical force in response to an applied electrical signal; and the piezoelectric material structure is fabricated using a light-assisted polymerization technique by causing crosslinking in a photolabile polymer solution.

In yet another implementation, a method to fabricate a device based on a piezoelectric material is provided to include directing an optical beam to a photolabile polymer solution containing piezoelectric nanoparticles; modulating and controlling the optical beam in a way that causes photopolymerizing of selected portions of the photolabile polymer solution to form a three dimensional piezoelectric material structure; and forming one or more electrical contacts to the three dimensional piezoelectric material structure to construct the device to apply an electrical control to the three dimensional piezoelectric material structure, or to receive an electrical response from the three dimensional piezoelectric material structure under a stress.

The above features and their implementations and other aspects of the disclosed technology are described in greater detail in the drawings, the description and the claims.

BRIEF DESCRIPTION OF THE DRAWINGS

FIG. 1A shows a block diagram of an exemplary digital projection printing setup that projects dynamic digital masks or pattern design on the photolabile polymer solution.

FIG. 1B shows an exemplary scanning electron micrograph of exemplary barium titanate nanoparticles grown via a hydrothermal process.

FIG. 1C shows an illustrative diagram of exemplary piezoelectric materials with exemplary barium titanate nanoparticles grafted to a polyethylene glycol diacrylate matrix.

DETAILED DESCRIPTION

Figure 1D:
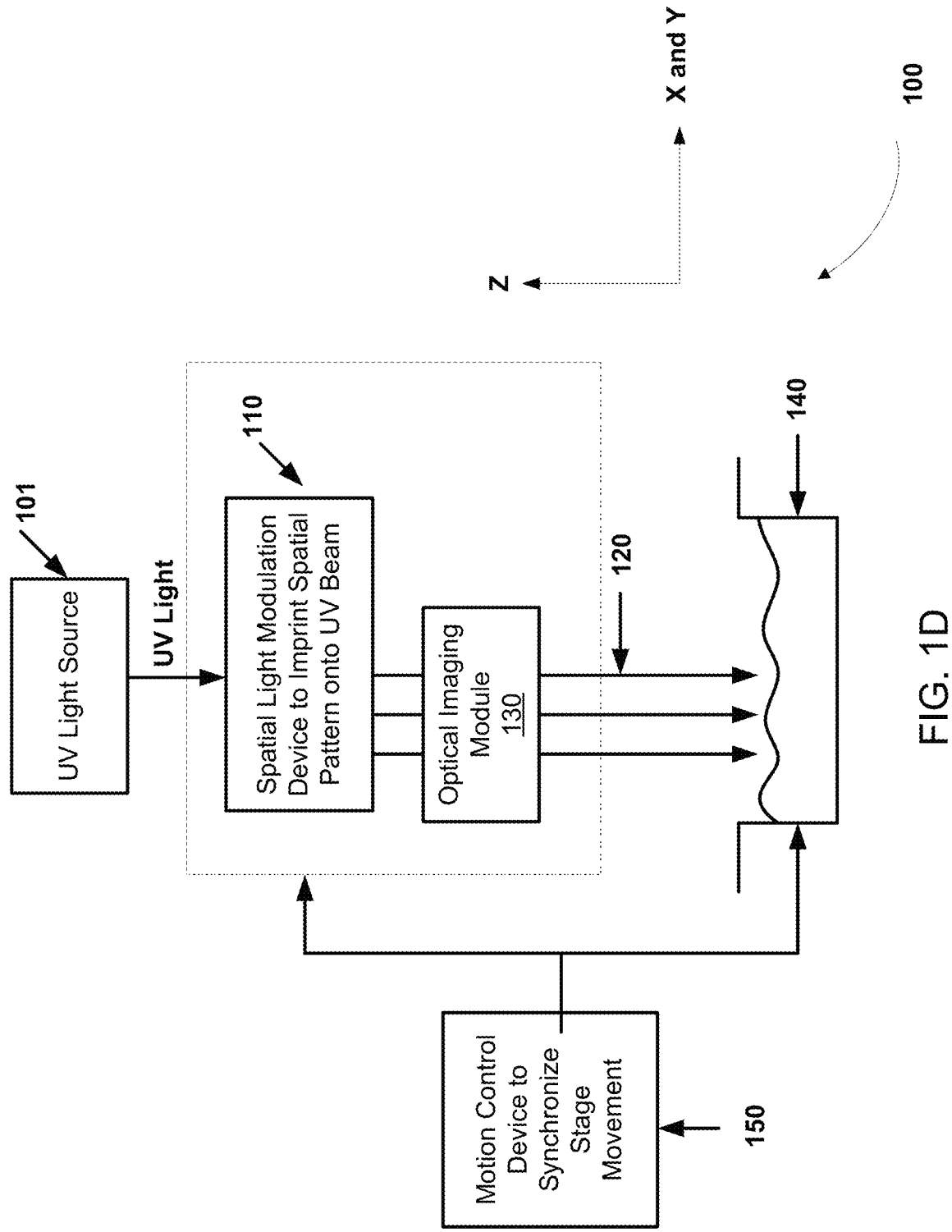
FIG. 1D shows an example of a fabrication system for 3D piezoelectric material.
Figure 2B:
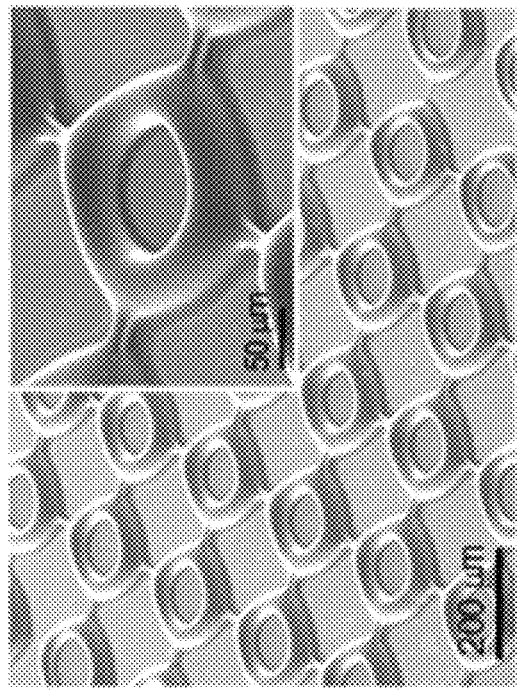
FIGS. 2A-2D show a collage of different microstructures including dot arrays, square arrays, and honeycomb arrays.
Figure 2D:
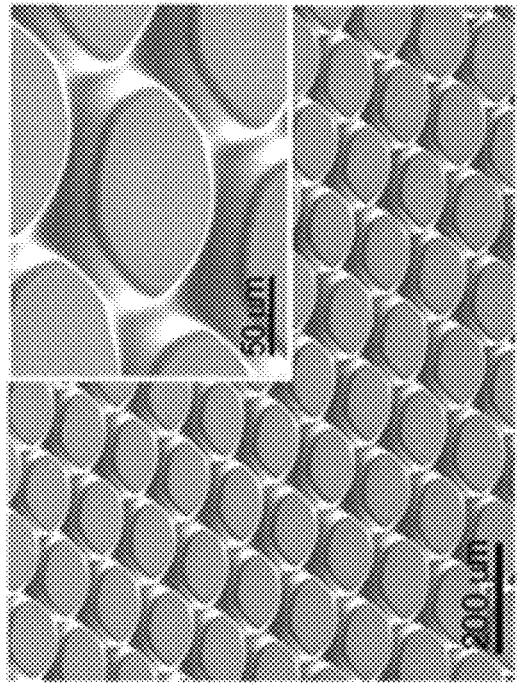
Figure 2A:
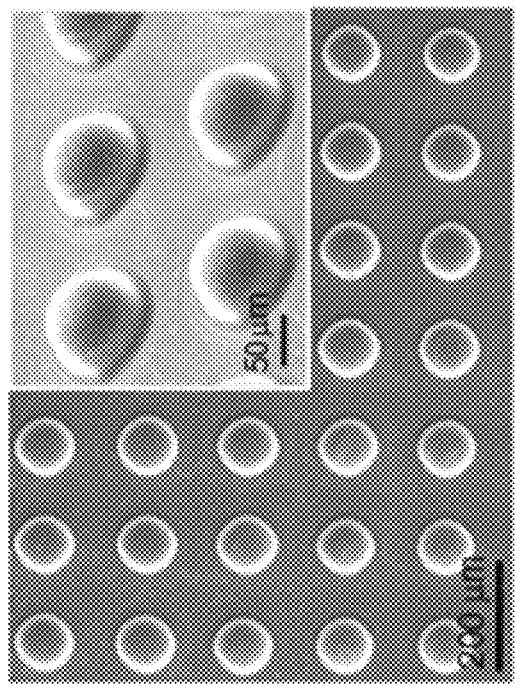
Figure 2C:
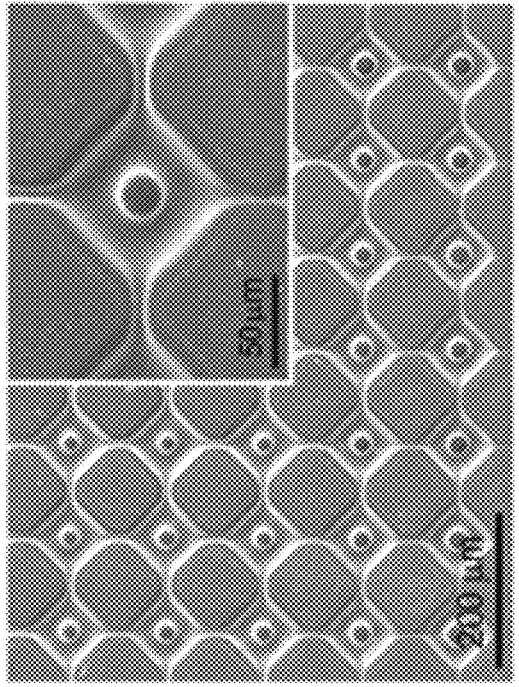

The ability to convert compressive/tensile stresses to an electric charge, or vice versa provides valuable property of piezoelectric materials in a wide range of applications that utilize the direct piezoelectric effect (e.g., mechanical stress forming an electric field) or converse piezoelectric effect (e.g., electric voltage forming a mechanical deformation). Some examples of applications based on piezoelectric materials include non-volatile low voltage memory, audio speakers, acoustic imaging, in systems are based on brittle ceramics such as lead zirconate titanate (PZT) which has one of the highest known piezoelectric coefficients (e.g., $d_{33}$ greater than 300 pC/N; depending on composite and processing conditions). Compared to PZT, piezoelectric polymers offer smaller piezoelectric responses while also offering several unique capabilities that make them ideal candidates for systems that require, for example, mechanical flexibility, smaller active elements, biocompatibility, and processability. Such piezoelectric polymers can include, for example, lead magnesium niobate-lead titanate $Pb(Mg_{1/3}Nb_{2/3})O_3$—$PbTiO_3$ (PMN-PT; $d_{33}$ up to approximately 2500 pC/N), or other perovskite-based oxides such as barium titanate (BTO; $d_{33}$ greater than 200 pC/N; depending on ceramic type and processing conditions).

Polyvinylidene fluoride (PVDF) is a pure polymer discovered in 1969 by Kawai. PVDF has a piezoelectric coefficient ($d_{33}$ approximately −20 to −34 pC/N) that is over an order of magnitude smaller than PZT. Due to its excellent mechanical flexibility, biocompatibility, and solution-based processability, it is actively being investigated for applications including non-volatile low voltage memory, acoustic transducers, and implantable medical devices. PVDF materials have a good piezoelectric polymer performance, yet it is difficult to fabricate these structures into individual active elements, complex architectures, or 3D patterns. Technologies in the area of micro- and nanofabrication of piezoelectric polymers can have an enormous impact on the development of biodiagnostics, nano- and microelectromechanical systems (NEMS/MEMS), imaging, sensors, and electronics.

Certain nano- and micro-fabrication techniques are currently available for producing ferroelectric and piezoelectric materials, e.g., including electron beam lithography, ion milling, soft lithography, self-assembly, electrospinning, and contact printing. However, existing implementations of these techniques tend to be complex and many of existing implementations do not offer simple approaches to fabricating 3D structures in piezoelectric polymers or multilayered architectures which would open up possibilities in the design of more complicated device geometries.

The technology disclosed in this patent document is based on the use of photolabile polymer solution and light projection techniques including projection stereolithography or direct photo-printing techniques including laser-assisted two-photon 3D printing. 3D manufacturing processes are disclosed to manipulate piezoelectric polymers into various desired shapes, configurations or geometries using light-assisted polymerization. In some implementations, stereolithography or direct photo-printing techniques including laser-assisted two-photon 3D printing are used to polymerize the piezoelectric materials.

Using light to polymerize the piezoelectric materials in photolabile solutions can be achieved in different ways. For example, light at a sufficient short wavelength such as UV wavelengths can be used to activate and cause crosslinking in a photolabile solution by a single photon absorption process.

Alternatively, laser-assisted two-photon polymerization is generally based on introducing laser energy to a photolabile solution at a precise space for a precise period of time to meet the nonlinear optical threshold for the two-photon polymerization. By focusing laser pulses on selected locations of the photolabile solution, the pulses initiate two-photon polymerization via two-photon absorption so that the photolabile solution is selectively crosslinked at certain locations to form a desired polymer structure while other parts of the photolabile solution remains in their salutation state. In implementation of this two-photon polymerization process, a laser selected can be at a laser wavelength that is longer than the one or more UV laser wavelengths suitable for causing the photolabile solution to crosslink via a single photon absorption so that such a longer laser wavelength would not be able to cause crosslink via a single photon absorption process without the nonlinear two-photon absorption process. Two-photon absorption is the simultaneous absorption of two photons to excite a molecule from one energy state to a higher energy state. Thus, laser-assisted two-photon 3D printing can allow a user to determine and precisely control the size and shape of the polymerized material.

In the above and other optically caused polymerization processes, the light beam is controlled spatially when illuminating the photolabile solution to cause crosslinking and create a desired spatial pattern of the polymerization in the photolabile solution along the X, Y and Z directions without causing crosslinking in other parts of the photolabile solution. The light beam can be controlled in various ways to achieve this. For example, the light beam of a suitable UV wavelength in a single photon absorption process or of a wavelength longer than the UV spectral range in a two-photon process can be spatially scanned while the optical power or intensity of the light beam is modulated based on the scanned positions to crate the desired spatial pattern along the X, Y and Z directions.

Notably, a spatial light modulation device may be used to imprint a two-dimensional spatial pattern across the light beam and this spatially modulated light beam can be projected into the photolabile solution to cause crosslinking and create the desired spatial pattern of the polymerization in the photolabile solution. Depending on the size of the cross section of the light beam relative to the cross-sectional size of the desired spatial pattern to be formed in the photolabile solution, the spatially modulated light beam may be projected once to complete the polymerization in the photolabile solution for the desired spatial pattern in a particular depth Z in the solution, or may be spatially scanned along X and Y directions to be projected into the photolabile solution one or more times with different spatial modulation patterns to complete polymerization in the photolabile solution for the desired spatial pattern in a particular depth Z in the solution. As a specific example for this implementation, a digital projection printing (DPP) is used to polymerize the piezoelectric materials. The concept of digital projection printing (DPP) is generally based on introducing images of UV light to photolabile solution. The images of UV light can be created by a digital micromirror-array device (DMD). The images of the UV light polymerize the photolabile solution at precise locations. This process is repeated to create additional layers of polymerized solution. The disclosed methods can include using piezoelectric nanoparticles grafted to a photolabile polymer solution to manufacture biocompatible, mechanically flexible, size scalable, shape tunable, and highly responsive piezoelectric materials.

An exemplary process for building 3D structures with stereolithography can include the exposure of light (typically from a laser or light emitting diode) to a photolabile liquid (e.g., polymer solution with acrylated monomer units) which creates cross-linked regions where the light irradiates the matrix. Once a single layer is carved out with the light, the sample is translated to allow the next layer to be written. The actual patterning can be programmed with Computer-Aided Design (CAD). In certain implementations, the spatial resolution can be limited by certain factors, e.g., actinic radiation, free radical diffusion, and the optical system designs and may be, in some systems, approximately 75 to 250 µm in the x-y direction and about 100 µm in the z-direction. The throughput of the stereolithography process in certain implementations may be slow when such implementations use the point-by-point scanning in the direct-write operation.

FIG. 1A illustrates an example a fabrication system for making 3D piezoelectric polymer structures or devices based on light-assisted polymerization using UV light. To achieve higher throughput and resolutions using the basic concepts of stereolithography, microscale digital projection printing (DPP) can be used to leverage a digital micromirror-array device (DMD) to produce a dynamic digital mask. The projected images from the DMD can be focused on the polymer solution and feature sizes as small as 1 µm can be generated by sequential polymerization steps.

FIG. 1A shows a block diagram of the exemplary digital projection printing (DPP) setup (100) that uses, for example, UV light from a light source (101) to project dynamic digital masks or pattern design produced by digital micromirror array device (DMD) (110) on a selected portion of the photolabile polymer solution supplied to a polymer holding platform 140 on which a desired 3D piezoelectric polymer structure is to be formed. For example, using the exemplary setup, any pattern can be digitized and the digital micromirror device (DMD) (110) can project any dynamic digital masks or pattern design in form of a spatially modulated UV light beam onto the polymer solution to polymerize a selected portion of the polymer solution at different locations based on the desired pattern design carried in to the spatially modulated UV light beam 120. An optical imaging module 130 can be used to perform the optical beam forming and focusing to project the spatially modulated UV light beam 120 into the polymer solution on the polymer holding platform 140. This process can be repeated in stages with same or different patterns to polymerize additional layers of the polymer solution to create, for example, 3D structures.

In an exemplary implementation of the disclosed technology to produce 3D photo-writable piezoelectric materials, piezoelectric nanoparticles were incorporated into a photolabile polymer solution, as shown in FIG. 1B. For example, after exposure to light, the liquid polymerizes and encapsulates the piezoelectric nanoparticles creating any 3D pattern defined by the user. FIG. 1B shows an exemplary scanning electron micrograph of exemplary BTO nanoparticles grown via a hydrothermal process.

An exemplary system is described for the exemplary work that leverages BTO nanoparticles embedded in a polyethylene glycol diacrylate (PEGDA) matrix, but the platform can be universal for other photolabile polymer solutions, e.g., including, but not limited to, [poly(methyl methacrylate), poly(acrylic acid), poly(lactic acid)] and piezoelectric nanoparticles (e.g., PZT, ZnO, PMN-PT, $NaNbO_3$). The BTO nanoparticles were synthesized using, for example, hydrothermal processing that combines metal alkoxides such as Ti-butoxide $(Ti[O(CH_2)_3CH_3]_4$ with metal hydroxides such as $Ba(OH)_2$ in an autoclave at 150-300° C. The mean diameter of the synthesized nanoparticles was 85±15 nm, as shown in FIG. 1C.

In an exemplary system, the chemical interface between the piezoelectric nanoparticle and the polymer matrix can provide the piezoelectric material with enhanced performance. For example, to enhance the stress transfer efficiency from the matrix to the BTO nanoparticles and boost the piezoelectric outputs of the fabricated materials, a linker molecule, such as 3-trimethoxysilylpropyl methacrylate (TMSPM), can be used to covalently link the BTO surface to the PEGDA matrix.

FIG. 1C shows an illustrative diagram showing the exemplary piezoelectric materials with the exemplary BTO nanoparticles (106) grafted to a PEGDA matrix (107). The exemplary zoomed section of the diagram shows the TMSPM linker (108) covalently linked to the nanoparticle surface and cross-linked with the PEGDA matrix (107).

Under light exposure the carbon-carbon double bonds of the TMSPM cross-link with the polymer matrix forming a strong bond between the piezoelectric nanoparticles and polymer network. For example, compared to other piezoelectric materials that utilize BTO nanoparticles embedded in an elastomer (e.g., polydimethylsiloxane (PDMS)) with carbon nanotubes (CNTs) as a mechanical-to-electrical enhancer, the direct grafting of molecular linkers provides a simpler and more efficient route to help funnel energy to the piezoelectric structures. In addition, for example, removing the CNTs significantly improves the optical transparency of the material. Other nanocomposite polymers that have also recently been demonstrated to produce strong piezoelectric outputs without the need for additives include systems such as PDMS/PMN-PT nanowire composites. After mixing the surface-treated BTO nanoparticles with the PEGDA solution, a photoinitiator such as 2,2-dimethoxy-2-phenylacetophenone (DMPA) or Irgacure 651 is added to generate free radicals in regions where only light is exposed. Once free radicals are formed they attack the carbon-carbon double bonds of the monomers in solution, producing acrylic monomers with free electrons that attack other monomers forming oligomers and eventually a vast cross-linked network. The chain reaction propagates until two radicals neutralize or the irradiation source is turned off. For the exemplary DPP set-up described, the microstructure arrays were fabricated in very short times (e.g., times of less than 2 seconds), but this can be tuned by altering variables such as irradiation power, photoinitiator concentration, monomer concentration, nanoparticle loading, and/or adding a quencher.

FIG. 1D shows an example of a fabrication system from which FIG. 1A is a specific implementation of this system. The spatial light modulation device 110 can be implemented in various forms for modulating the UV light from the UV light source 101 to carry a desired light modulation corresponding to a partial location (X, Y and Z) in the polymer solution carried by the platform 140. In the example in FIG. 1A, a DMD is used as this spatial light modulator. In other implementations, other light modulation devices may be used. The motion control device 150 can be coupled to the spatial light modulator 110, the optical imaging module 130, or the assembly formed by the spatial light modulator 110 and the optical imaging module 130 that would control the relative positioning of the UV beam 120 with respect to the X, Y and Z positioning of the focused UV light on the platform 140. The motion control device 150 can also be coupled to the platform 140. In the position control along the vertical direction Z, the fabrication process may be performed at one layer at a time in the polymer solution and subsequently polymerize the subsequent layers of the polymer solution above a previously solidified layer to form a final 3D structure.

By controlling the digital photomask, virtually any shape can be projected onto the polymer solution and printed within seconds. FIGS. 2A-2D show a collage of different microstructures, e.g., including dot arrays (FIG. 2A), square arrays with different sized void spaces (FIGS. 2B and 2C), and honeycomb arrays (FIG. 2D) that were fabricated using the exemplary DPP apparatus coupled with a 365 nm light source. Although similar structures on pure polymers can be produced with other fabrication methods such as contact printing, the photo-printing process can be carried out over much larger areas with high reproducibility and fidelity. For 3D direct printing the stage can be translated in the z-direction (perpendicular to substrate surface) while the projected image is altered. The exemplary piezoelectric microstructures of FIGS. 2A-2D were fabricated in less than 2 seconds using a PEGDA solution loaded with 1% of the TMSPM-modified BTO nanoparticles.

Figure 3A:
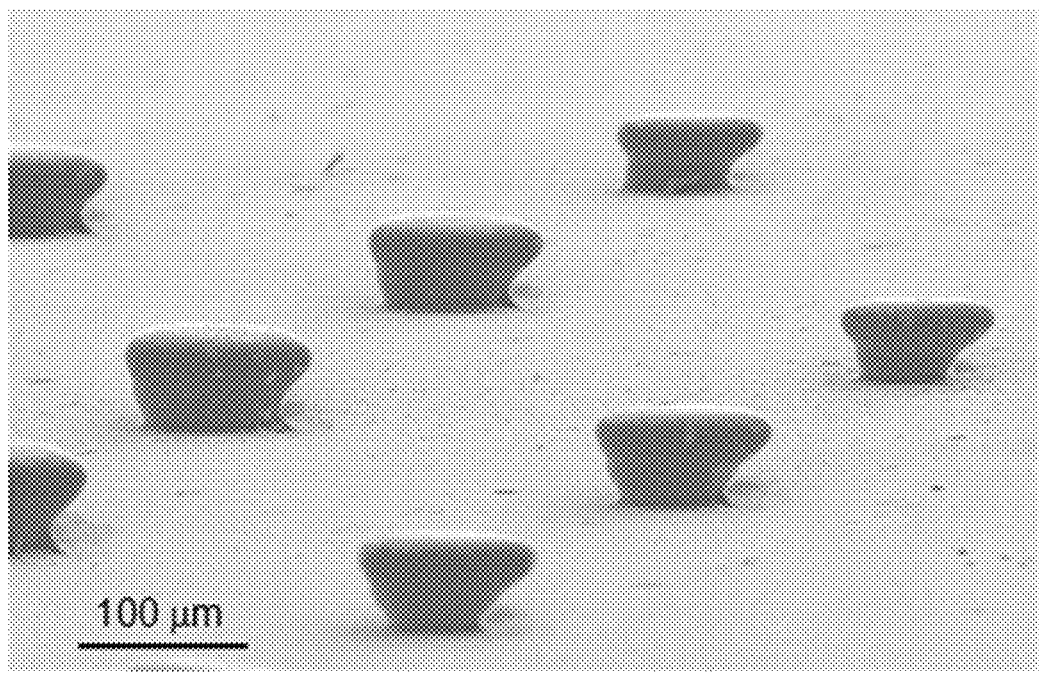
FIG. 3A shows an image of an exemplary 3D mushroom-like array grown using dynamical optical projection stereo-lithography.
Figure 3B:
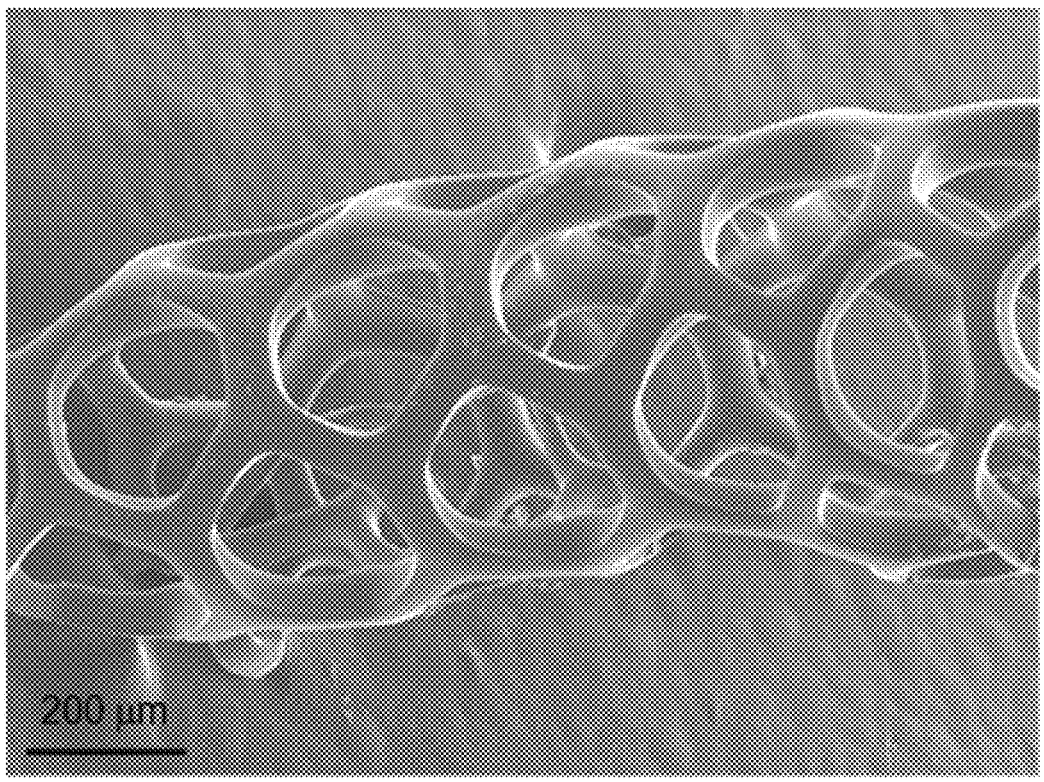
FIG. 3B shows an image of an exemplary microtubule shape.

FIG. 3A shows an image of an exemplary 3D mushroom-like array grown using, for example, dynamic optical projection stereolithography. FIG. 3B shows an image of an exemplary microtubule shape. For example, after releasing a film fabricated into a honeycomb array, the structure rolls up into a microtubule shape due to slight stress gradients in the films.

FIG. 3A shows an arbitrary mushroom-like array that has a smaller base diameter compared to the top. By focusing the projected light on a plane in the liquid (or liquid surface), and synchronizing the stage movement with the incremental change in the projected features, 3D structures can be carved out with smooth side walls using, for example, a process called dynamic optical projection stereolithography.

For some exemplary structures, designs may require complex void regions layered on top of each other or when structures need to be hollowed out. This may mainly be due to the polymer absorption process being activated by single photons which limits how deep the light can be focused into the material without initiating polymerization. Anywhere light hits the sample will create free radicals, so designs have to be optimized to limit exposure times to regions of the liquid outside the focal area and optical quenchers have to be used to lower the rate of free radical formation in unwanted areas of the beam path. Nonlinear optical processes such as two-photon absorption (TPA) can be employed to circumvent the 3D printing issues of single photon absorption, but there may be a trade off in fabrication time since TPA may require point-by-point scanning.

Figure 11:
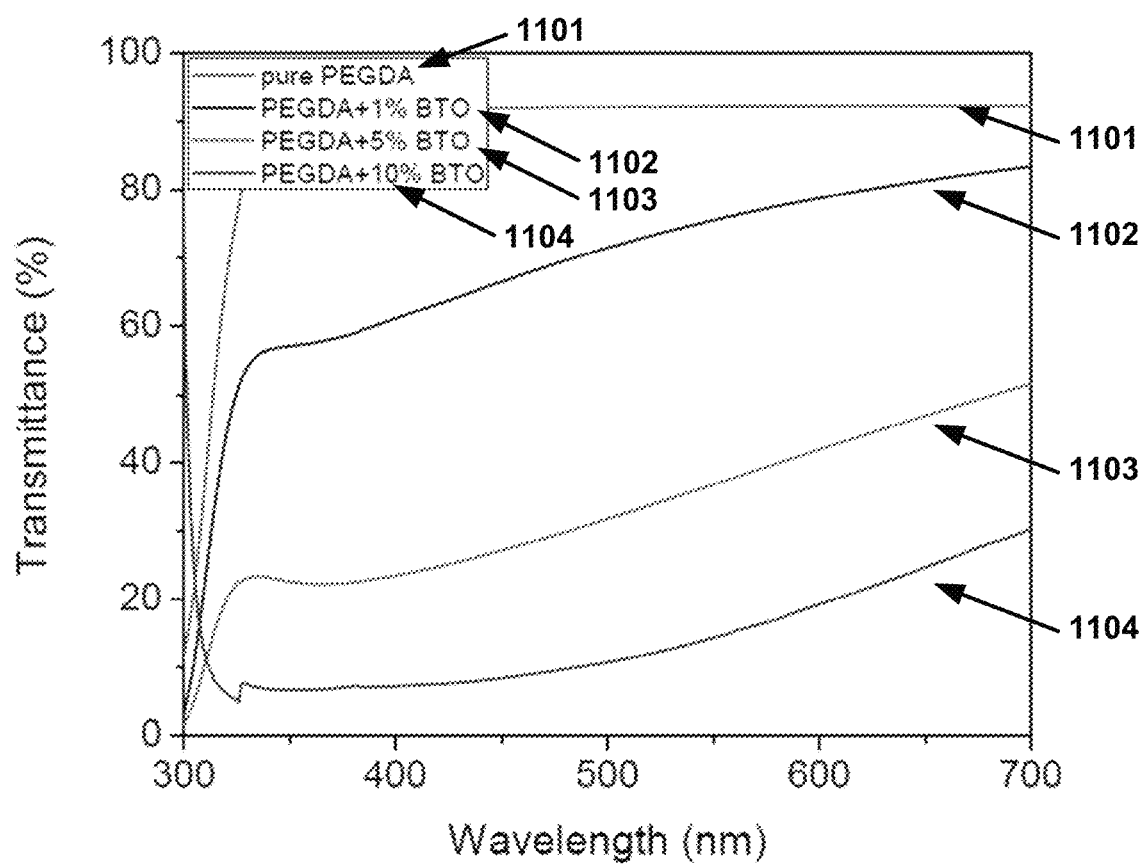
FIG. 11 shows the UV-Visible spectra of pure PEGDA, and PEDGA/BTO solutions of 1%, 5%, and 10%.

These exemplary patterns demonstrate the ability to reach an exemplary resolution of DPP (e.g., approximately 1 μm) with curved, adjoining, straight, and void regions. For example, since a composite material was used, the resolution will be strongly dependent on the light-matter interaction of the BTO nanoparticles. For example, in the exemplary implementations, the BTO mass loadings of 1-10% and 1% photoinitiator produced excellent transfer efficiencies of the mask to the solid polymer structures while still offering strong piezoelectric outputs and similar mechanical properties to the pure PEGDA materials. FIG. 11 shows the UV-Visible spectra of pure PEGDA (1101), and PEDGA/BTO solutions of 1% (1102), 5% (1103), and 10% (1104). The transmittance is directly related to the BTO loading fraction and shows higher transmission at longer wavelength. When the loading goes above 10% the transparency of the polymer goes below 5% at 365 nm which washes out the projected mask and causes shape distortions similar to what is observed in overexposed photoresists. Extinction spectra of the BTO nanoparticles, shown in subsequent figures, clearly showed the direct relationship between light-matter interactions and the BTO concentration. For example, higher loading fractions should be tolerable if tighter light sources are used, the photopolymerization wavelength is tuned so that it falls in the higher transmission (longer wavelengths) region of the colloidal polymer solution, or if TPA techniques are utilized.

The exemplary composite materials have to be activated in order to become piezoelectric. This can require that the dipoles in the perovskite crystallites be aligned using a poling field that is larger than the coercive field (approximately 10 V/µm) of the BTO nanoparticles. In the exemplary implementations, this was achieved using indium tin oxide (ITO) coated glass slides as the top and bottom electrodes, which also served as the top and bottom surface of the photofabrication cell. By placing an elastomeric spacer (e.g., PDMS or Kapton film) between the conductive glass substrates, the maximum height of the photofabricated structure can be defined and precise fields can be applied to polarize the BTO nanoparticles. After activating the composite materials the fabricated films can either be left on the glass slides for testing and characterization, removed to create free-standing structures, or transferred to other substrates for further integration. If the photo-printing is carried out on a substrate that has weak interactions with the PEGDA composite (e.g., hydrophobic surface), the structured films can roll up to make higher order structures, as shown in FIG. 3B. For example, the exemplary microtube shown in FIG. 3B is one example where a honeycomb pattern is projected onto the nanoparticle composite solution and after polymerization is removed from the substrate which causes the sheet to roll up into well-defined tubules. This exemplary process should be controllable by fabricating bilayers with different thermal expansion coefficients, densities, or lattice parameters which would govern the diameter of the tube and extent of the rolling.

The exemplary implementation included characterizing the piezoelectric properties of the materials by applying specific loads to the polymerized films and measuring the electrical outputs. As expected, there was a significant enhancement in the cross-linked films that contain the TMSPM linker (no CNTs) compared to the piezoelectric material without the linker but with CNTs (1%), for example. In fact, under similar loads (e.g., 1.44 N normal to plane of the film), the material with the grafted nanoparticles displayed a greater than three times boost in the piezoelectric output over the CNT composites, as shown in the data plot of FIG. 4A. There was no response in films fabricated with 1) untreated BTO nanoparticles and no CNTs or 2) unpolarized materials containing TMSPM. Quantifying the piezoelectric response of the 10% BTO loaded CNT composites and TMSPM-grafted materials gave effective piezoelectric coefficient ($d_{33}$) values of 13±2 pC/N and 39±3 pC/N, respectively. These exemplary values for the grafted materials are already exceeding that of pure polymers such as PVDF, which may warrant further investigation into the upper limit of the photolabile materials and systematically studying the dependence of the piezoelectric properties on nanoparticle composition, polymer matrix, nanoparticle size, and linker chemistry. The large increase in the piezoelectric coefficient is directly related to the mechanical interface between the BTO surface and PEGDA matrix which aids in the mechanical-to-electrical energy conversion process by efficiently tunneling the strain of the polymer chains to the piezoelectric crystals. Although the piezoelectric properties of the piezoelectric materials were lower than BTO monolithic ceramics (e.g., greater than 200 pC/N), the piezoelectric materials are performing with a much lower density of active material.

Figure 4A:
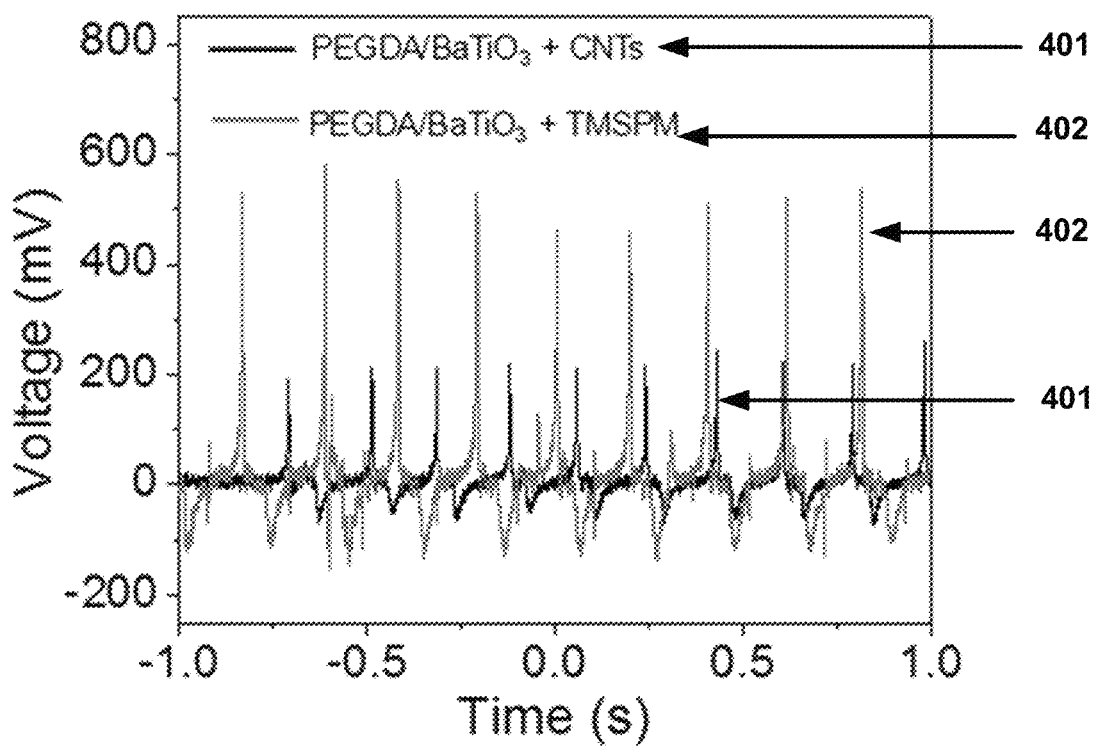
FIG. 4A shows a data plot of the voltage response of photopolymerized piezoelectric material cycled under a load applied perpendicular to the surface of the film.
Figure 4B:
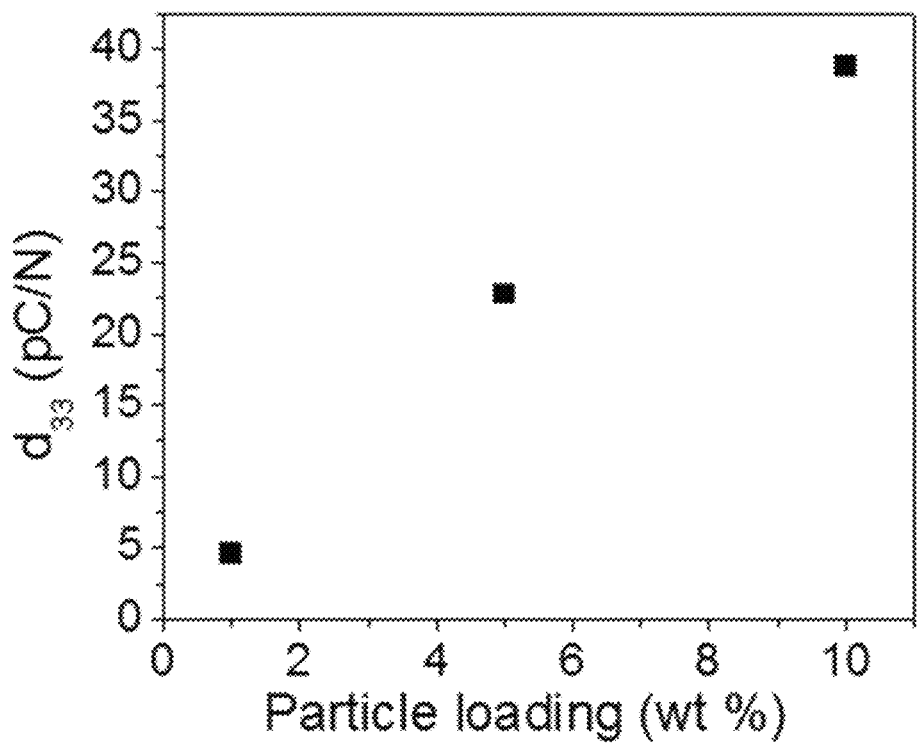
FIG. 4B shows a data plot of the effective piezoelectric modulus as a function of barium titanate mass loading.

The exemplary implementations included analyzing the piezoelectric coefficient as a function of BTO mass loading, as shown in FIG. 4B. The data plot of FIG. 4B shows a clear trend towards higher $d_{33}$ values as the nanoparticle density increases. This upward trend should continue to increase and likely peak at some higher mass loading, but currently it is difficult to photo-fabricate films above 10% loading due to the large extinction coefficients. To address this, smaller nanoparticles with weaker light-matter interactions can be used.

FIG. 4A shows a data plot of the voltage response of photopolymerized piezoelectric materials cycled under a 1.44 N load applied perpendicular to the surface of the film. The films with TMSPM and no CNTs (402) showed an approximately three fold increase in the piezoelectric output compared to films with CNTs and no TMSPM (401). FIG. 4B shows a data plot of the effective piezoelectric modulus ($d_{33}$) as a function of BTO mass loading.

Methods Implemented in the Exemplary Implementations

Figure 9:
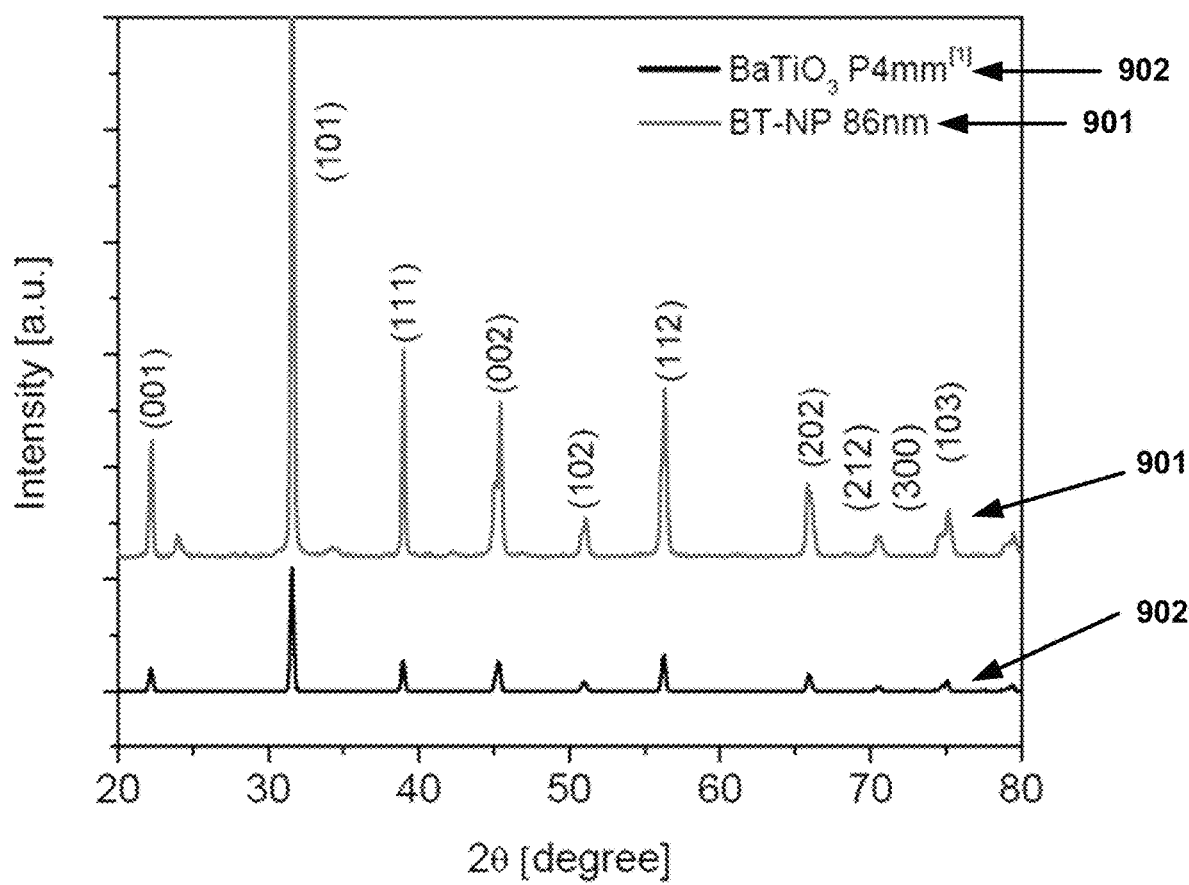
FIG. 9 shows pattern of the as-made BTO nanoparticles and a reference $BaTiO_3$ pattern.

Barium Titanate (BTO) Nanoparticle Synthesis:

BTO nanoparticles were synthesized by hydrothermal methods. The exemplary precursors for the reaction included barium hydroxide monohydrate ($Ba(OH)_2$—$H_2O$) [Sigma Aldrich, 98%], titanium butoxide ($Ti[O(CH)_2CH_3]_4$ [Ti-butoxide; Sigma Aldrich, 97%], and diethanolamine ($NH(CH_2CH_2OH)_2$ [DEA, Fisher Scientific, laboratory grade). First, 25 mmol of Ti-butoxide was added to 10 mL of ethanol followed by the addition of 3.5 mL of ammonia. The Ti-butoxide solution was then mixed with the Ba-hydroxide solution which contained 37.5 mmol of Ba-hydroxide in 12.5 mL DI water. The DEA (2.5 mL) was then added to the solution to help control the size of the nanoparticles. The final solution was transferred to Teflon lined stainless steel reactor and the reactor was kept in oven at 200° C. for 16 hours. After the reaction, the reactor was cooled down to room temperature and the particles were cleaned 10 times with a vacuum filter using ethanol and DI water. The final product was dried at 80° C. for 24 hours. FIG. 9 shows the x-ray diffraction pattern of the as-made BTO nanoparticles (901) and a reference $BaTiO_3$ pattern (902). The x-ray diffraction spectra indicate that the nanoparticles have a strong tetragonal phase given their c/a ratio of 1.007. The spectra were recorded using a Bruker D9 X-ray diffractometer.

Figure 10:
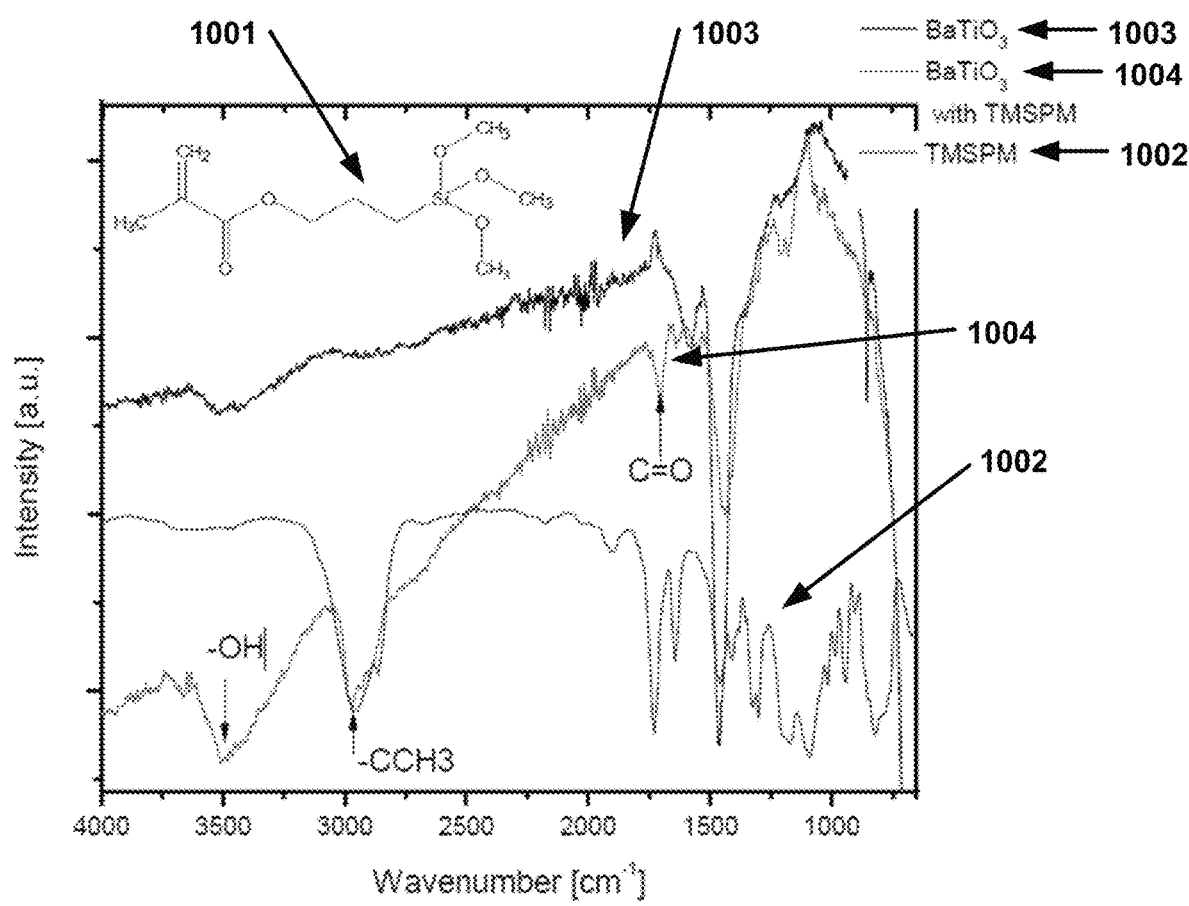
FIG. 10 shows chemical structure of TMSPM, and the FTIR spectra of pure TMSPM, as-made BTO nanoparticles, and TMSPM-grafted BTO nanoparticles.

Preparation of PEGDA and BTO Nanoparticle Materials:

Prior to mixing the BTO nanoparticles with the polyethylene glycol diacrylate (PEGDA) solutions, the dried nanoparticles were functionalized with 3-trimethoxysilylpropyl methacrylate (TMSPM) using similar grafting strategies to those carried out on silica surfaces. The TMSPM solution included 1 mL TMSPM dissolved in 50 mL of ethanol and mixed with an acetic acid solution (e.g., 1 mL acetic acid in 9 mL of DI water). The BTO nanoparticles (approximately 6 g) were then added to the TMSPM solution and sonicated for 24 hours. After the surface functionalization step, the particles were cleaned with copious amounts of ethanol and water and dried. FIG. 10 shows chemical structure of TMSPM (1001), and the FTIR spectra of pure TMSPM (1002), as-made BTO nanoparticles (1003), and TMSPM-grafted BTO nanoparticles (1004). FTIR measurements were taken on as-made and freshly functionalized nanoparticles. The bands at 2862-2882 cm$^{-1}$ are attributed to C—CH$_3$ and O—CH$_3$ groups and the band at 1720 cm$^{-1}$ is attributed to the C=O group. The samples were washed with copious amounts of ethanol and water prior to taking spectra and provide good evidence (along with the enhanced piezoelectric properties) that the TMSPM is grafted to the surface of the BTO nanoparticles. The spectra were recorded using a Spectrum Two spectrometer (Perkin Elmer). To prepare the BTO-loaded PEGDA solutions, appropriate BTO:PEGDA weight ratios were used to achieve the desired mass loading and the samples were sonicated for greater than 24 hours prior to photopolymerization.

Figure 8:
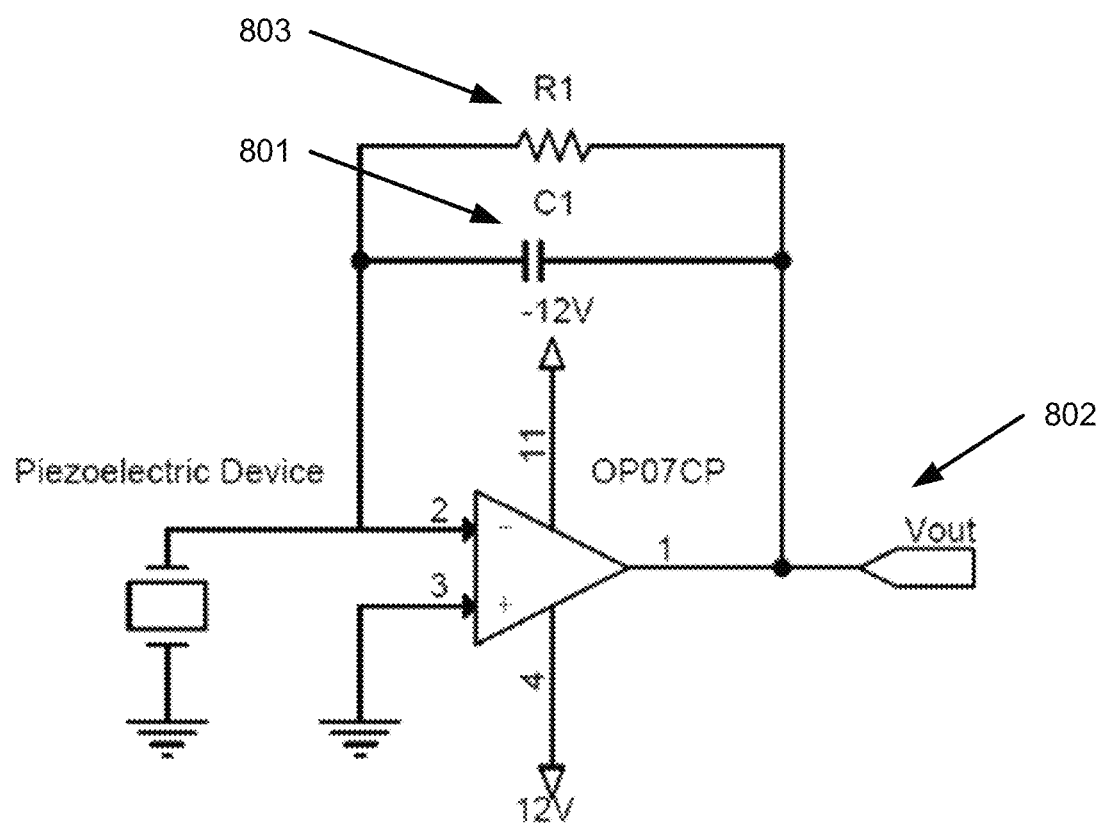
FIG. 8 shows a schematic of the charge amplifier used in the piezoelectric experiments
Figure 12A:
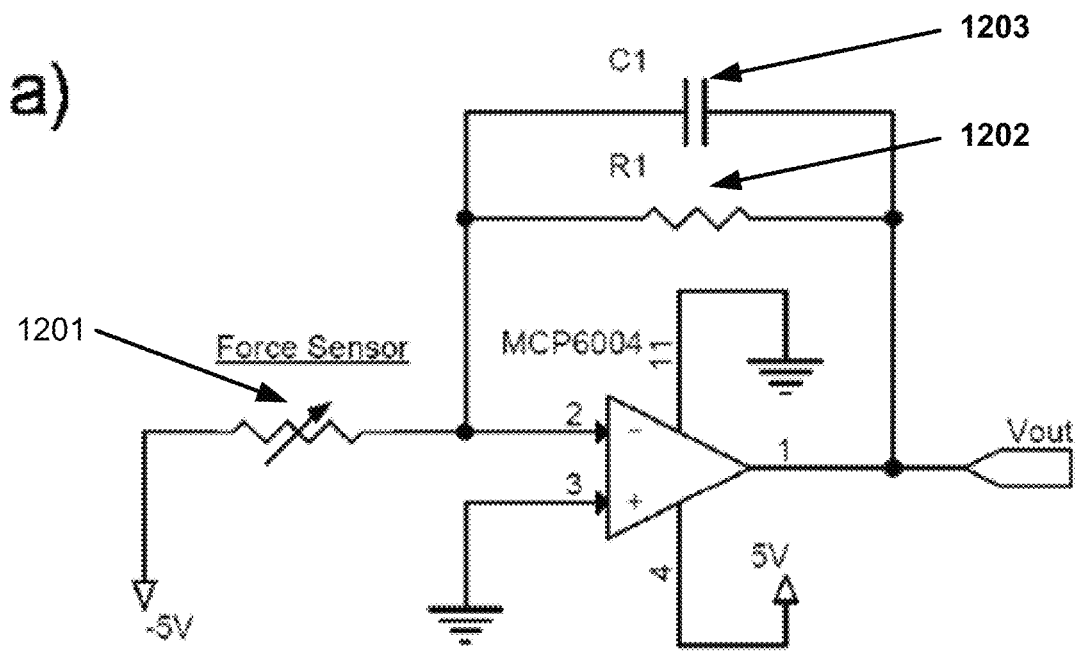
FIGS. 12A-12B show a schematic of the FlexiForce sensor (Tekscan) circuit and the calibration curve.
Figure 12B:
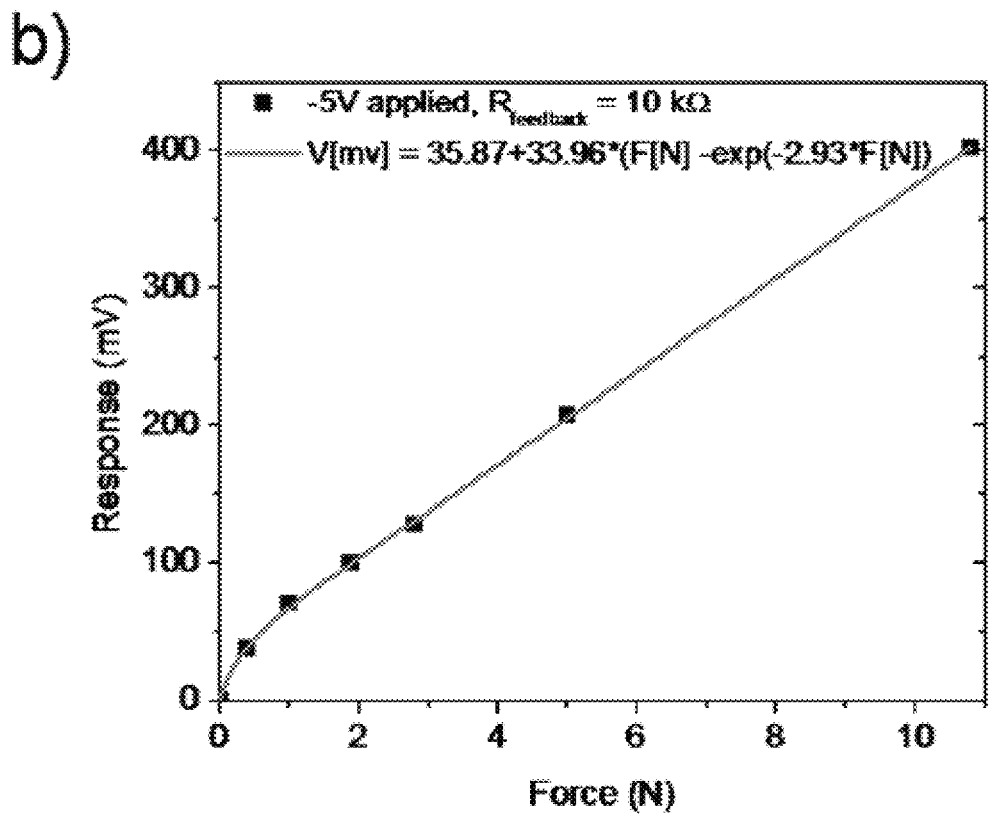

Optical Printing and Film Preparation:

The optical printing cells included cover glass slides coated with 100 nm of ITO deposited by magnetic sputtering. The electrodes were covered with approximately 1 μm of polymethyl methacrylate (PMMA) to prevent shorting. A photoinitiator such as 2,2-dimethoxy-2-phenylacetophenone (DMPA) or 2,2-dimethoxy-1,2-di(phenyl)ethanone (Irgacure 651) was added to the PEGDA composites at a concentration of 1 wt %. The PEGDA composite was then placed between the two electrodes using a 25 μm Kepton film spacer and the polymer could be polymerized using 365 nm light from an LED (for DPP) or a hand held UV lamp (for film preparation). The power of the hand held lamp was much lower than the LED which required longer exposure times (minutes) to photopolymerize. Electrical wires were connected to the electrodes using silver epoxy and the photopolymerized samples were electrically poled at a field of approximately 12 MV/m at 120° C. for 24 hours. The piezoelectric properties of the polymers were characterized using a commercially available force sensor (Tekscan, A201) and a home-built charge amplifier. FIGS. 12A-12B show a schematic of the FlexiForce sensor (Tekscan) circuit and the calibration curve. As shown in FIG. 12A, the piezoelectric polymer was placed in between two PDMS pieces prior to placing on the force sensor (1201) to protect the materials during the mechanical test and to distribute the load equally over the active area of the piezoelectric. However, it was found that there are minimal differences between similar loads with different contact areas. The output voltage of the sensor could be tuned by changing the supply voltage and the feedback resistor, $R_1$ (1202). The capacitor, $C_1$ (1203), was used as the bypass capacitor. As shown in FIG. 12B, under the most sensitive set-up (−5 V supplied and $R_1$=10 kohm) the sensor shows a linear relationship with respect to load above 2 N and an exponential relation below 2 N. FIG. 8 shows a schematic of the charge amplifier used in the piezoelectric experiments. Charge generated from the piezoelectric polymer is transferred to the reference capacitor, $C_1$ (801), and produces an output voltage, $V_{OUT}$ (802), that is equal to the voltage across $C_1$ (801). The $V_{OUT}$ (802) can be expressed as $V_c = -Q_{GENERATED}/C_1$. In the experiments a 100 pF capacitor (and 20 Mohm feedback resistor, $R_1$ (803)) was used as the reference capacitor allowing the piezoelectric coefficient, $d_{33}$, to be calculated from $d_{33} = V_{OUT} \times 100$ pF/$F_{APPLIED}$.

The disclosed technology includes a 3D printing process for fabricating piezoelectric materials. In some implementations, for example, by embedding piezoelectric nanoparticles in a photolabile polymer solution, optical images can be projected onto the polymer solution causing photopolymerization to occur wherever the medium is exposed. To enhance the mechanical-to-electrical conversion process of the piezoelectric materials, the surface of the piezoelectric nanoparticles can be chemically modified with linker molecules that could cross-link with the polymer matrix under light exposure. This can allow the nanoparticles to become encapsulated by the polymerization process and grafted to the solidified polymer network. The exemplary resolution is affected by the spot size of the light source which can be significantly reduced using different light sources, wavelengths, nonlinear optical effects such as TPA, and/or higher focusing components. With the potential to print virtually any 3D piezoelectric shape, while maintaining a strong piezoelectric coefficient and biocompatible properties, the disclosed technology can find immediate application in integrated micro/nanoelectromechanical systems, sensors, bio-imaging, and energy scavenging.

Figure 5:
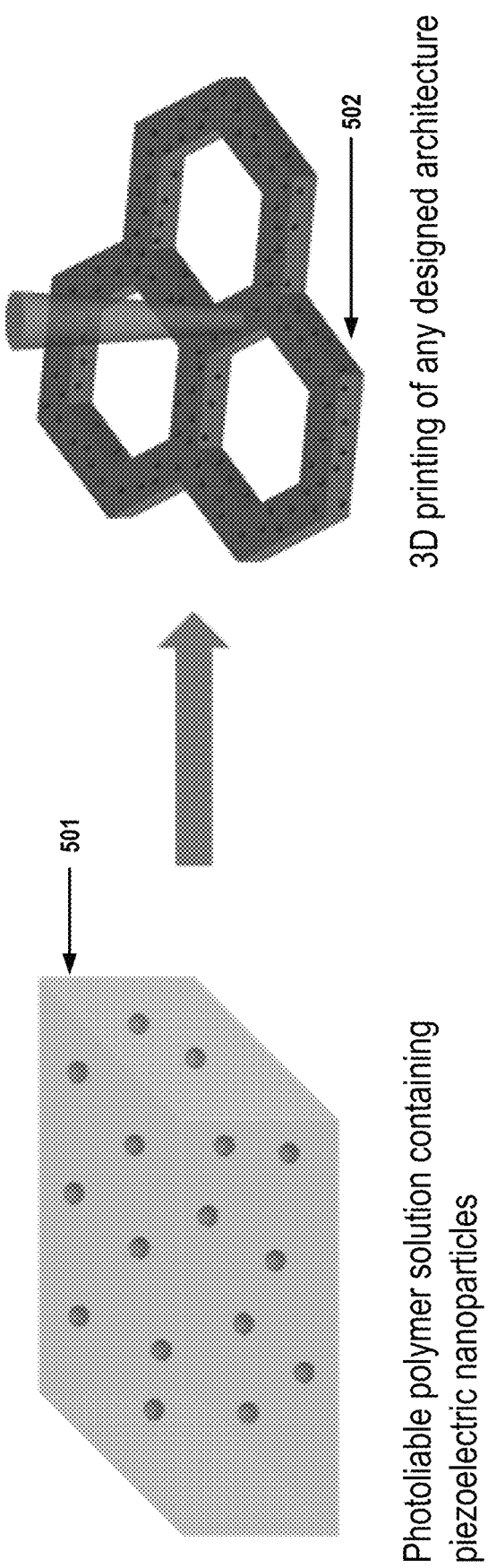
FIG. 5 show schematic diagrams of an exemplary photofabrication method of the disclosed technology to produce piezoelectric materials

In some aspects, a method of the disclosed technology includes photopolymerizing a photolabile polymer solution (e.g., acrylated polyethylene glycol—PEGDA) containing piezoelectric nanoparticles (e.g., such as BTO, PZT, ZnO, or NaNbO$_3$), like that shown in FIG. 5. In one aspect, a method includes photopolymerizing a selected portion of a two dimensional plane in a sample (501) of a photolabile polymer solution containing piezoelectric nanoparticles to form a layer of a piezoelectric material (502), the photopolymerizing including directing light from a light source based on a pattern design in the selected portion of the photolabile polymer solution; and moving one or both of the sample and the directed light to photopolymerize another selected portion of another two dimensional plane in the sample to form another layer of the piezoelectric material. Similar strategies can also be used to incorporate pure piezoelectric polymers, e.g., such as PVDF, by making blends of the photolabile polymer solution with the piezoelectric polymer. Under light exposure the carbon-carbon double bonds of the polymer chains cross-link forming a covalently linked network. To achieve stronger binding to the polymer matrix, and enhance mechanical-to-electrical energy conversion, the surface of the piezoelectric nanoparticles can be chemically modified with linkers containing acrylate end groups, like that shown in FIG. 6B. An example of a silane-based compound is 3-trimethoxysilylpropyl acrylate (TMSPA). After mixing the modified nanoparticles with the polymer solution, the materials can be printed using various photopolymerization process such as microstereolithography (μSL) or two-photon polymerization (TPP) or Digital Projection Printing (DPP). As an example of this, FIG. 6C shows a simple honeycomb and star shape created using a μSL setup that projects 365 nm light onto a PEGDA/BTO solution deposited on an indium tin oxide (ITO) surface. The exemplary piezoelectric properties of the film is activated by applying an electric field greater than the coercive field of the BTO nanoparticles (greater than 10 V/μm). FIG. 6D shows exemplary results that depict the piezoelectric voltage of the grafted nanoparticles enhanced by approximately 4 times, e.g., as compared to materials that contain carbon nanotubes (CNTs). The addition of CNTs (without any other linkage between the nanoparticles and polymer matrix) has been shown to significantly increase outputs over nanoparticle-only materials.

Figure 6B:
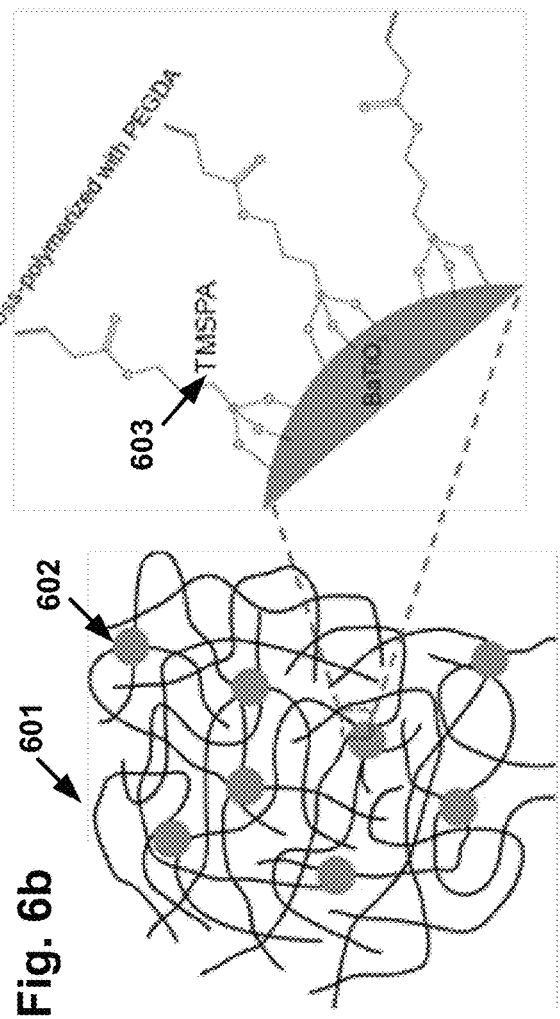
FIGS. 6A-6D show exemplary electron micrograph images and illustrative diagrams showing exemplary piezoelectric materials produced by the disclosed methods.
Figure 6A:
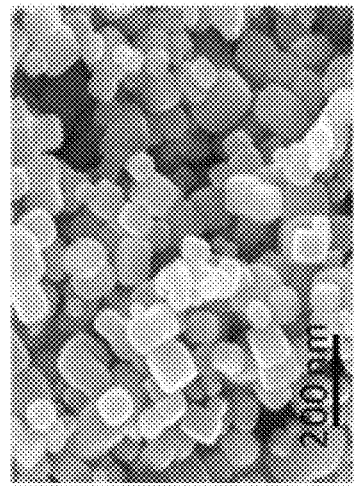
Figure 6D:
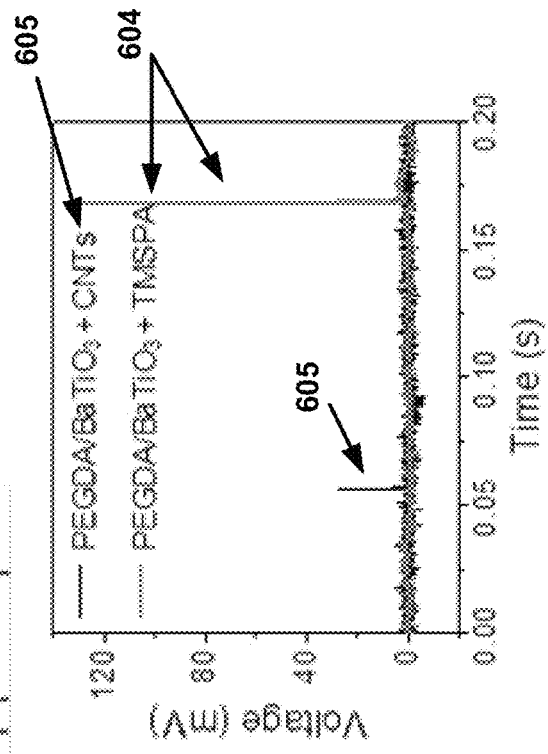
Figure 6C:
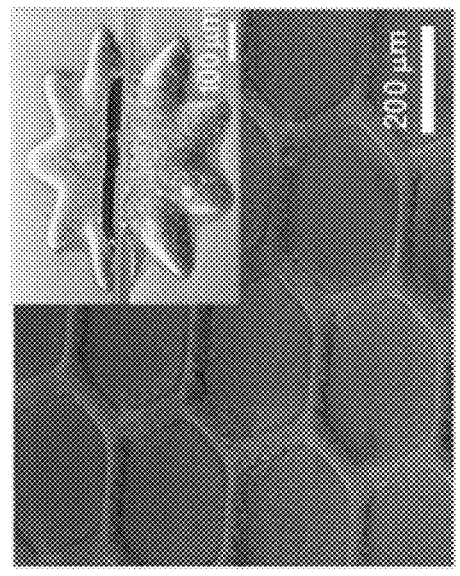

FIG. 6A-6D shows exemplary electron micrograph images and illustrative diagrams showing exemplary piezoelectric materials produced by the disclosed methods. FIG. 6A shows an exemplary electron micrograph of BTO nanoparticles grown via a hydrothermal process. FIG. 6B shows an illustrative diagram depicting the exemplary piezoelectric material with BTO nanoparticles (602) grafted to a PEGDA matrix (601). FIG. 6B includes an inset showing a zoomed area depicting the TMSPA linker (603) covalently linked to the nanoparticle surface (602) and PEGDA matrix (601). FIG. 6C shows exemplary scanning electron micrographs (SEM) of a honeycomb and star shape (with a scratch to show thickness) fabricated out of a PEGDA/BTO materials using μSL. FIG. 6D shows exemplary results of the voltage response of photopolymerized materials under an approximately 5 N load with CNTs and no TMSPA (604), and with TMSPA and no CNTs (604), and showing that there is no response without CNTs and TMSPA.

Figure 7:
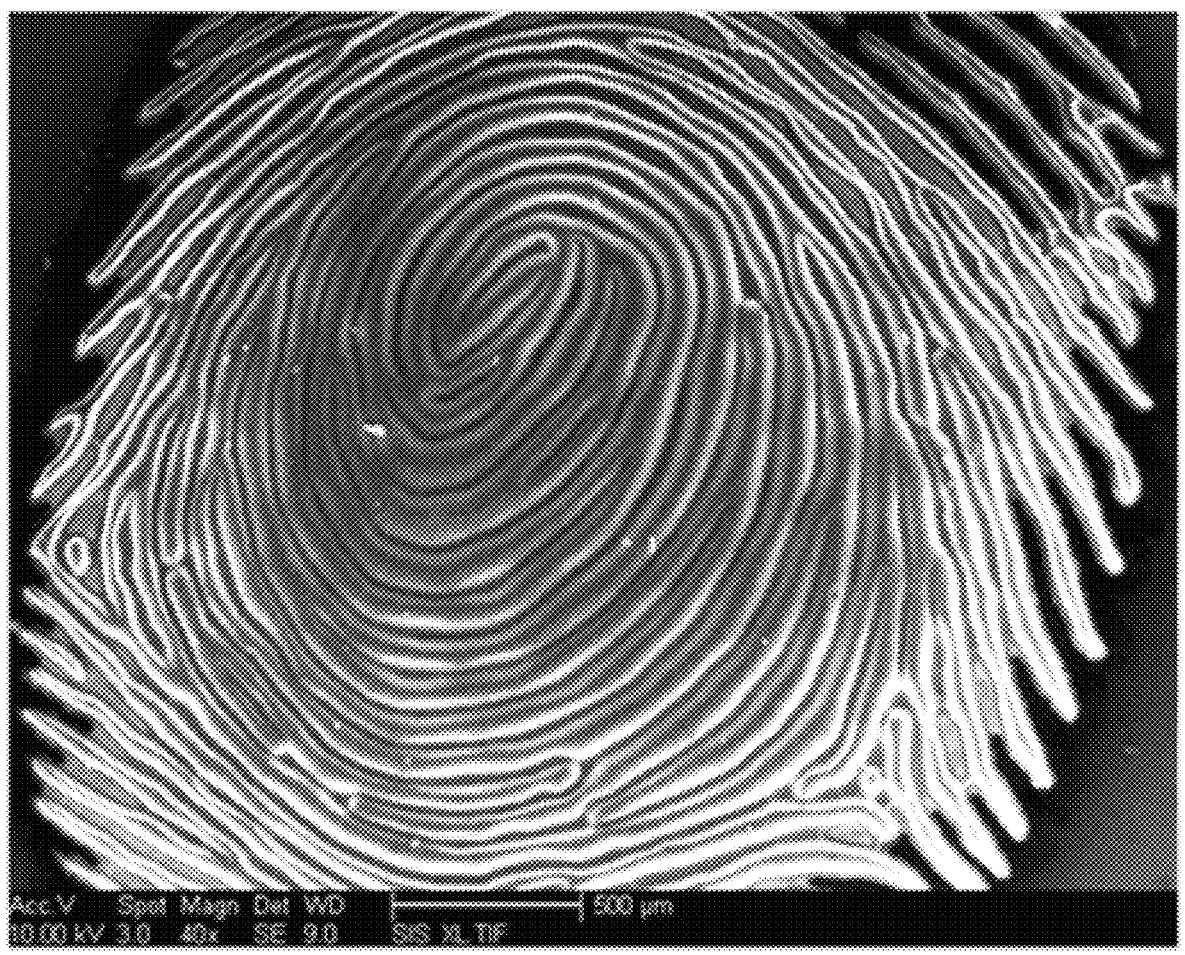
FIG. 7 shows an electron micrograph of an exemplary piezoelectric material fabricated into a 3D fingerprint structure.

Using the disclosed techniques, other more complex 3D piezoelectric structures can be fabricated. For example, FIG. 7 shows an exemplary fingerprint structure created using the disclosed technology. Complex 3D piezoelectric structures can be created to facilitate one or more of biocompatible, mechanically flexible, size scalable, shape tunable, and highly responsive piezoelectric materials.

The disclosed technology can also be implemented to print variable 3D piezoelectric shapes, while maintaining a strong piezoelectric coefficient and biocompatible properties, and thus is applicable to biomimetic materials (e.g., artificial skin, tympanic membrane), integrated micro/nanoelectromechanical systems (MEMS/NEMS, e.g., such as mechanical actuators), sensors (e.g., acoustic detection), bio-imaging (e.g., high resolution, compact ultrasonic imaging instruments), in vitro energy scavenging, and biometrics and security, among others.

Figure 13A:
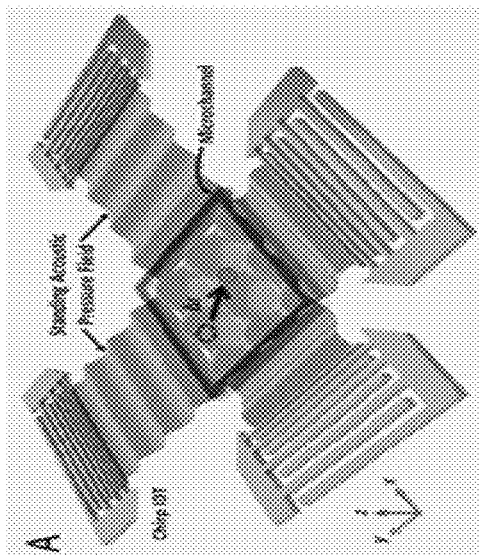
FIGS. 13A-13F show several exemplary applications for 3D piezoelectric material.

FIGS. 13A-13F illustrate some of the suitable applications using the 3Dpiezoelectric materials and the disclosed technology in applications. For example, as shown in FIG. 13A, 3D piezoelectric material can be used to determine biometrics of an individual. In such an application, 3D piezoelectric material can be used, for example, in a sensor attached to an individual. When the individual moves, the 3D piezoelectric material generates a direct piezoelectric effect that can be measured and analyzed. In another application, the 3D piezoelectric material can be used for generating biomimetic materials such as artificial skin or tympanic membrane. In the case of the tympanic membrane, vibrations in the ear canal can be converted to electrical signals by the 3D piezoelectric material.

Figure 13C:
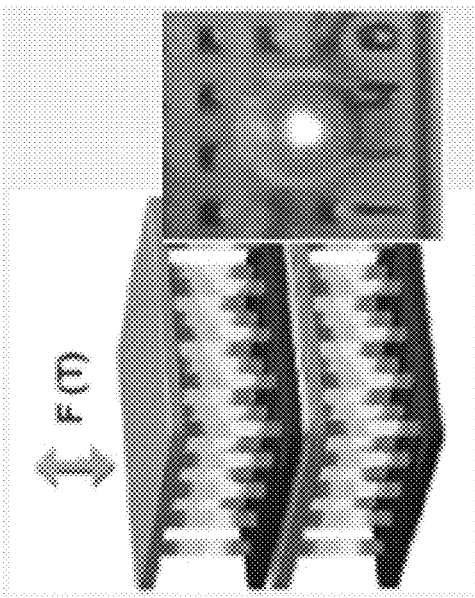
Figure 13E:
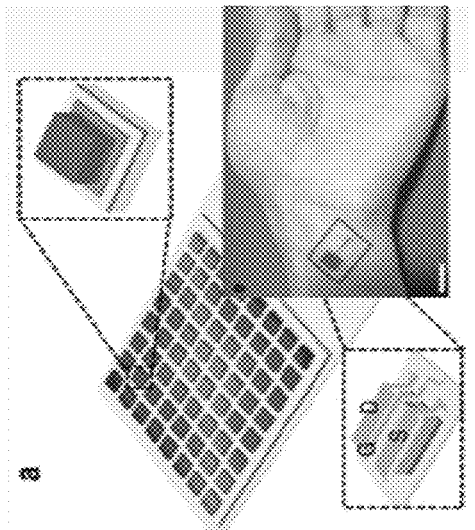
Figure 13B:

In FIG. 13B, 3D piezoelectric material can be used in micro/nanoelectromechanical systems (MEMS/NEMS, e.g., such as mechanical actuators). Based on an electrical signal, the 3D piezoelectric material can generate a mechanical response.

In FIG. 13C, 3D piezoelectric material can be used to harvest energy. For example, if a 3D piezoelectric material is directly or indirectly connected to an individual, any movement generated by the individual can generate an electrical response in the 3D piezoelectric material. Such an electrical response can be used, for example, to charge a battery in a wearable device, such as a FitBit or Apple Watch, and in medical devices.

Figure 13D:
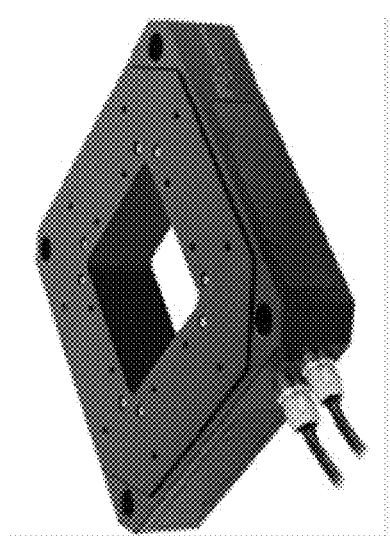

In FIG. 13D, 3D piezoelectric material can be used in micro/nanoelectromechanical systems to convert electrical stimuli to mechanical strain.

In FIG. 13E, 3D piezoelectric material can be used for acoustic manipulation. For example, 3D piezoelectric material can be used in speakers to convert electrical stimuli to mechanical strain.

Figure 13F:
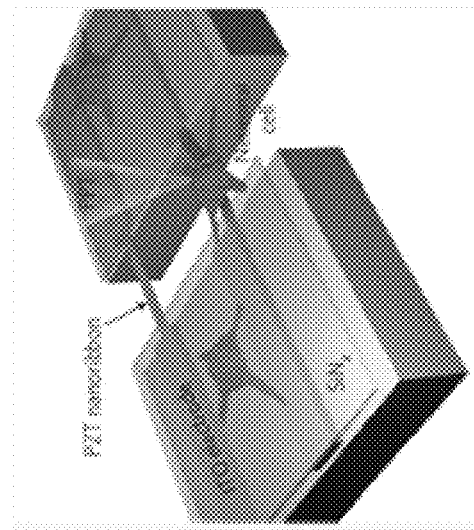

In FIG. 13F, 3D piezoelectric material can be used in acoustic imaging systems, for example, in a transducer to convert electrical stimuli to mechanical strain, and vice versa.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Additional enhancements and variations can be made based on what is described and illustrated in this patent document.

What is claimed is:

1. A device comprising a piezoelectric material structure which includes:
    a three-dimensional polymeric microstructure that includes a plurality of piezoelectric nanoparticles embedded in a photocured polymer matrix; and
    acrylate containing linker molecules that covalently link the plurality of piezoelectric nanoparticles to the photocured polymer matrix,
    wherein the linker molecules are trimethoxysilylpropyl methacrylate (TMSPM) linker molecules, and
    wherein the piezoelectric material structure has a voltage response approximately between 400 mV and 600 mV under an applied load of 1.44N.

2. The device as in claim 1, wherein the plurality of piezoelectric nanoparticles includes any one or more of barium titanate (BTO), lead magnesium niobate-lead titanate (PMN-PT), lead zirconate titanate (PZT), zinc oxide (ZnO), and sodium niobate ($NaNbO_3$).

3. The device as in claim 1, wherein the piezoelectric material structure exhibits biocompatible, mechanically flexible, size scalable, shape tunable, directly piezoelectrically responsive, or conversely piezoelectrically responsive.

4. The device as in claim 1, further comprising a mechanical-to-electrical enhancer, wherein the mechanical-to-electrical enhancer includes carbon nanotubes (CNTs).

5. The device as in claim 1, wherein the device is a biometric sensor based on the piezoelectric material structure operable to convert mechanical stress to electrical signals.

6. The device as in claim 1, further comprising a sensing circuit coupled to the piezoelectric material structure to receive an electrical signal produced by the piezoelectric material structure in response to a mechanical stress applied thereto.

7. The device as in claim 1, wherein the device is a microelectromechanical or nanoelectromechanical device based on the piezoelectric material structure operable to convert one or more of mechanical stress to electrical signals or electrical signals to mechanical stress.

8. The device as in claim 1, wherein the device is a wearable device operable to convert mechanical stress to electrical signals to charge a battery.

9. The device as in claim 1, wherein the device is an acoustic speaker based on the piezoelectric material structure operable to convert electrical signals to mechanical stress for audio sound production.

10. The device as in claim 1, wherein the device is an acoustic imaging system based on the piezoelectric material structure operable to convert mechanical stress to electrical signals in receiving ultrasound image signals for imaging reconstruction or to convert electrical signals to mechanical stress in transmitting ultrasound signal for imaging.

11. The device as in claim 1, wherein the photocured polymer matrix includes polyethylene glycol diacrylate (PEGDA), and wherein a ratio of a mass loading of the plurality of piezoelectric nanoparticles to the photocured polymer matrix that includes the PEGDA comprises 1% to 10% by weight.

12. The device as in claim 1, wherein the plurality of piezoelectric nanoparticles have a mean diameter of 85±15 nm.

13. The device as in claim 1, wherein the acrylate containing the linker molecules include 3-trimethoxysilylpropyl methacrylate (TMSPM).

14. The device as in claim 13, wherein the plurality of piezoelectric nanoparticles are TMSPM grafted piezoelectric nanoparticles that have a piezoelectric coefficient ($d_{33}$) value of 39±3 pC/N.

15. The device as in claim 1, wherein the acrylate containing the linker molecules include 3-trimethoxysilylpropyl acrylate (TMSPA).

16. The device as in claim 15,
wherein the linker molecules include the TMSPA, and
wherein the piezoelectric material structure under an applied load of 5N yields a voltage response of approximately 120 mV.

17. A device comprising a piezoelectric material structure which includes:
a three-dimensional polymeric microstructure that includes a plurality of piezoelectric nanoparticles embedded in a photocured polymer matrix; and
acrylate containing linker molecules that covalently link the plurality of piezoelectric nanoparticles to the photocured polymer matrix,
wherein the acrylate containing the linker molecules include 3-trimethoxysilylpropyl acrylate (TMSPA),
wherein the linker molecules include the TMSPA, and
wherein the piezoelectric material structure under an applied load of 5N yields a voltage response of approximately 120 mV.

18. The device as in claim 17, further comprising a mechanical-to-electrical enhancer, wherein the mechanical-to-electrical enhancer includes carbon nanotubes (CNTs).

19. The device as in claim 17, wherein the photocured polymer matrix includes polyethylene glycol diacrylate (PEGDA), and wherein a ratio of a mass loading of the plurality of piezoelectric nanoparticles to the photocured polymer matrix that includes the PEGDA comprises 1% to 10% by weight.

20. The device as in claim 17, wherein the plurality of piezoelectric nanoparticles have a mean diameter of 85±15 nm.

* * * * *